(12) United States Patent
Kim et al.

(10) Patent No.: US 12,707,812 B2
(45) Date of Patent: Aug. 11, 2026

(54) DISPLAY DEVICE INCLUDING MULTI-LAYERED ELECTRODES AND METHOD OF FABRICATING THE SAME

(71) Applicant: Samsung Display Co., LTD., Yongin-si (KR)

(72) Inventors: Hyoung Sik Kim, Seoul (KR); Jong Hee Park, Hwaseong-si (KR); Hong Sick Park, Suwon-si (KR); Woo Jin Cho, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 760 days.

(21) Appl. No.: 17/975,809

(22) Filed: Oct. 28, 2022

(65) Prior Publication Data

US 2023/0292550 A1 Sep. 14, 2023

(30) Foreign Application Priority Data

Mar. 8, 2022 (KR) ........................ 10-2022-0029039

(51) Int. Cl.
*H10K 59/121* (2023.01)
*H10D 86/40* (2025.01)
(Continued)

(52) U.S. Cl.
CPC ....... *H10K 59/1213* (2023.02); *H10D 86/441* (2025.01); *H10D 86/60* (2025.01);
(Continued)

(58) Field of Classification Search
CPC .. H10K 59/1213; H10K 59/131; H10K 59/88; H10K 71/00; H10K 59/1201;
(Continued)

(56) References Cited

U.S. PATENT DOCUMENTS 7,897,450 B2 * 3/2011 Koehler ............ H10P 14/69433 438/791
7,902,640 B2 * 3/2011 Hsu .................... H10D 30/0316 257/E21.293

(Continued)

FOREIGN PATENT DOCUMENTS

KR 10-2005-0099027 10/2005
KR 10-2016-0082409 7/2016

(Continued)

OTHER PUBLICATIONS

Office Action for Korean Application No. 10-2022-0029039 dated Dec. 1, 2025. KR 20210145907 A.

*Primary Examiner* — Caleb E Henry
(74) *Attorney, Agent, or Firm* — Harness, Dickey & Pierce, P.L.C.

(57) ABSTRACT

A display device includes: a substrate; a thin-film transistor disposed on the substrate and including a semiconductor layer; an interlayer insulating layer disposed on the thin-film transistor; a data conductive layer disposed on the interlayer insulating layer and including an auxiliary electrode and a transistor electrode connected to the semiconductor layer of the thin-film transistor, a via layer disposed on the data conductive layer; a pixel electrode layer disposed on the via layer and including: a pixel electrode and a dummy pixel electrode separated from the pixel electrode; an intermediate layer disposed on the pixel electrode layer; and a common electrode disposed on the intermediate layer. The auxiliary electrode includes a main conductive layer and an upper sub-conductive layer. Side surfaces of the main conductive layer of the auxiliary electrode are disposed inner than side surfaces of the upper sub-conductive layer of the auxiliary electrode.

24 Claims, 25 Drawing Sheets

(51) Int. Cl.
*H10D 86/60* (2025.01)
*H10K 59/12* (2023.01)
*H10K 59/131* (2023.01)
*H10K 59/88* (2023.01)
*H10K 71/00* (2023.01)

(52) U.S. Cl.
CPC ....... *H10K 59/1201* (2023.02); *H10K 59/131* (2023.02); *H10K 59/88* (2023.02); *H10K 71/00* (2023.02)

(58) Field of Classification Search
CPC ......... H10K 59/80522; H10K 59/1315; H10K 50/814; H10K 59/122; H10K 59/123; H10K 59/124; H10K 71/231; H10K 71/166; H10K 59/1216; H10K 59/8051; H10K 59/8052; H10K 59/80516; H10D 86/441; H10D 86/60; H10H 29/142; H01L 27/1214; H01L 27/1225; H01L 27/124; H01L 29/41733; H01L 29/42384; H01L 29/7869; H01L 27/3262; H01L 27/3276; H01L 51/56; H01L 27/3248; H01L 21/02063; H01L 27/1251; H01L 27/3258; H01L 29/78606; H01L 29/78618
See application file for complete search history.

(56) References Cited

U.S. PATENT DOCUMENTS 9,853,067 B2 * 12/2017 Cai ........................ H10D 86/60
10,134,912 B2 * 11/2018 Kimura ................ G09G 3/3648
10,483,339 B2 * 11/2019 Moon .................. H10K 59/123
10,991,784 B2 * 4/2021 Kwon .................. H10D 86/423
2005/0275038 A1 * 12/2005 Shih ................... H10D 30/6755 257/382
2006/0157754 A1 * 7/2006 Jeon ...................... H10P 14/693 438/257
2006/0234430 A1 * 10/2006 Liu ...................... H10K 10/474 438/149
2008/0085583 A1 * 4/2008 Park .................. H10P 14/69392 257/E29.302
2010/0001346 A1 * 1/2010 Ye ...................... H10D 30/6755 257/E21.411
2013/0270527 A1 * 10/2013 Kwon ................ H10D 30/6723 254/43
2014/0183528 A1 * 7/2014 Endo .................... H10D 86/481 257/43
2014/0273342 A1 * 9/2014 Yim ................... H10D 30/6755 438/104
2017/0194415 A1 * 7/2017 Choi .................... H10K 50/828
2017/0278977 A1 * 9/2017 Jeong ................. H10D 30/6755
2017/0294498 A1 * 10/2017 Kwon .................. H10D 86/423
2018/0026055 A1 * 1/2018 Rui ...................... H10D 86/481 257/71
2018/0061922 A1 * 3/2018 Kim ................... H10K 59/1213
2019/0088793 A1 * 3/2019 Kimura ................ G09G 3/3648
2020/0258966 A1 * 8/2020 Cha .................... H10K 59/1216

FOREIGN PATENT DOCUMENTS

KR 10-2017-0072726 6/2017
KR 10-2021-0016145 2/2021
KR 20210145907 A 12/2021

* cited by examiner

A
MSK
MSK_TR
MSK_BL
Light
Light
151
140
110
SUB1
CLS2
CLM
CLS1
CLS2
CLM
CLS1
AUE
SCE
DNE
GE
121
123
122
120
130
BML
DR3
DR2
DR1

FIG. 19

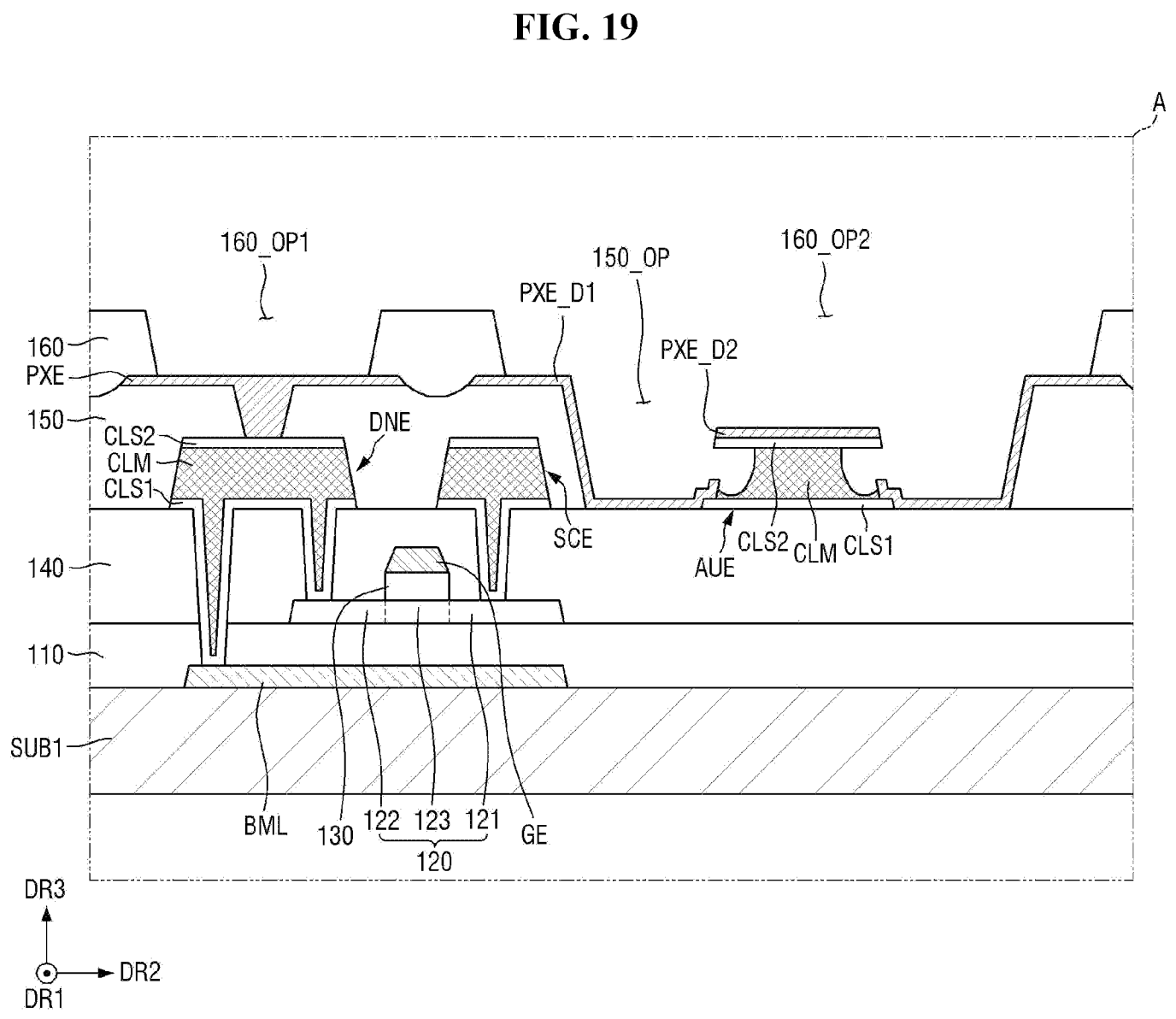

A
160_OP2
150_OP
PXE_D2
CLS1
CLM
CLS2
AUE
PXE_D1
SCE
GE
121
123
122
120
130
DNE
160_OP1
BML
CLS2
CLM
CLS1
160
PXE
150
140
110
SUB1
DR3
DR2
DR1

A
160_OP1
160_OP2
150_OP
PXE_D1
PXE_D2
EML
DNE
SCE
AUE
CLS2
CLM
CLS1
GE
121
123
122
120
130
BML
EML
160
PXE
150
140
110
SUB1
DR3
DR2
DR1

A
160_OP1
160_OP2
150_OP
PXE_D1
PXE_D2
EML
CME
CLS2
CLM
CLS1
AUE
SCE
DNE
GE
121
123
122
120
130
BML
CME
EML
160
PXE
150
140
110
SUB1
DR3
DR2
DR1

A
160_OP1
160_OP2
150_OP
PXE_D1
PXE_D2
EML
CME
CLS2
CLM
CLS1
AUE
SCE
DNE
GE
121
123
122
120
130
BML
CME
EML
160
PXE
150
140
110
SUB1
DR3
DR2
DR1

FIG. 25

DISPLAY DEVICE INCLUDING MULTI-LAYERED ELECTRODES AND METHOD OF FABRICATING THE SAME

CROSS-REFERENCE TO RELATED APPLICATION(S)

This application claims priority to and benefits of Korean Patent Application No. 10-2022-0029039 under 35 U.S.C. § 119, filed on Mar. 8, 2022, in the Korean Intellectual Property Office (KIPO), the entire contents of which are incorporated herein by reference.

BACKGROUND

1. Technical Field

Embodiments relate to a display device and a method of fabricating the display device.

2. Description of the Related Art

Electronic devices such as smartphones, tablet personal computers (PCs), digital cameras, notebook computers, navigation devices, and smart televisions that provide images to users include display devices for displaying images.

A display device includes a pixel electrode and a common electrode. The pixel electrode is individually driven for each pixel by a thin-film transistor. The same voltage is applied to the common electrode regardless of the pixels.

As a display screen becomes larger, the size of the common electrode increases. Thus, a voltage drop phenomenon may occur due to the resistance of the common electrode itself, thereby deteriorating display quality.

SUMMARY

Embodiments provide a display device capable of reducing or minimizing a voltage drop phenomenon of a common electrode.

Embodiments provide a method of fabricating a display device capable of reducing or minimizing a voltage drop phenomenon of a common electrode by using a simple method.

Additional features of embodiments will be set forth in the description which follows, and in part may be apparent from the description, or may be learned by practice of an embodiment or embodiments herein.

According to an embodiment, a display device may include: a substrate; a thin-film transistor disposed on the substrate, the thin-film transistor including a semiconductor layer; an interlayer insulating layer disposed on the thin-film transistor; a data conductive layer disposed on the interlayer insulating layer and including an auxiliary electrode and a transistor electrode connected to the semiconductor layer of the thin-film transistor, each of the auxiliary electrode and the transistor electrode including: a main conductive layer, and an upper sub-conductive layer disposed on an upper surface of the main conductive layer; a via layer disposed on the data conductive layer; a pixel electrode layer disposed on the via layer, the the pixel electrode layer including: a pixel electrode connected to the transistor electrode through a contact hole penetrating the via layer, and a dummy pixel electrode separated from the pixel electrode, the dummy pixel electrode including: a first dummy pixel electrode disposed adjacent to the auxiliary electrode, and a second dummy pixel electrode disposed on an upper surface of the auxiliary electrode and separated from the first dummy pixel electrode; an intermediate layer disposed on the pixel electrode layer, the intermediate layer including: a first portion disposed adjacent to the auxiliary electrode, and a second portion disposed on the upper surface of the auxiliary electrode and separated from the first portion of the intermediate layer; and a common electrode disposed on the intermediate layer, the common electrode including: a first portion disposed adjacent to the auxiliary electrode, and a second portion disposed on the upper surface of the auxiliary electrode, wherein the auxiliary electrode may have an undercut shape in which side surfaces of the main conductive layer of the auxiliary electrode are disposed inner than side surfaces of the upper sub-conductive layer of the auxiliary electrode, the first portion of the intermediate layer may expose an end portion of the first dummy pixel electrode disposed on a side of the auxiliary electrode, and the first portion of the common electrode may contact the first dummy pixel electrode exposed by the first portion of the intermediate layer.

The main conductive layer of the transistor electrode and the main conductive layer of the auxiliary electrode may include aluminum, and the upper sub-conductive layer of the transistor electrode and the upper sub-conductive layer of the auxiliary electrode may include titanium.

The auxiliary electrode may have a width by which the side surfaces of the upper sub-conductive layer may protrude from the side surfaces of the main conductive layer, and the width of the auxiliary electrode may be in a range of about 0.3 μm or more.

A lower end portion of the main conductive layer of the auxiliary electrode may include a tip portion.

Each of the auxiliary electrode and the transistor electrode may further include a lower sub-conductive layer disposed on a bottom surface of the main conductive layer and including titanium.

Side surfaces of the lower sub-conductive layer of the auxiliary electrode may protrude from the side surfaces of the main conductive layer.

The auxiliary electrode may have a width, by which the side surfaces of the lower sub-conductive layer protrude from the side surfaces of the main conductive layer, may be smaller than the width of the auxiliary electrode by which the side surfaces of the upper sub-conductive layer protrude from the side surfaces of the main conductive layer.

The first dummy pixel electrode may contact the lower sub-conductive layer.

The first portion of the common electrode may contact a side surface of the main conductive layer of the auxiliary electrode.

The common electrode may further include a third portion disposed on a lower surface of the upper sub-conductive layer. The first portion, the second portion and the third portion of the common electrode may be integral with each other.

Each of the auxiliary electrode and the transistor electrode may further include a lower sub-conductive layer disposed on a bottom surface of the main conductive layer. Side surfaces of the lower sub-conductive layer of the auxiliary electrode may protrude from the side surfaces of the main conductive layer of the auxiliary electrode. The lower sub-conductive layer of the auxiliary electrode may contact the first dummy pixel electrode.

The display device may further include a scan wiring and a data wiring driving the thin-film transistor. The data wiring and the auxiliary electrode may extend in a first direction, and the scan wiring extends in a second direction intersecting the first direction.

The via layer may include an opening exposing the auxiliary electrode.

The opening of the via layer may extend in the first direction.

The pixel electrode and the first dummy pixel electrode may be separated from each other on an upper surface of the via layer. The upper surface of the via layer exposed between the pixel electrode and the first dummy pixel electrode may be recessed.

According to an embodiment, a display may include a substrate, a first electrode and a second electrode disposed on the substrate, each of the first and second electrodes including a first sub-conductive layer, a main conductive layer and a second sub-conductive layer that are stacked sequentially, and a via layer covering the first electrode and exposing the second electrode. A side surface of the first sub-conductive layer of the first electrode, a side surface of the main conductive layer of the first electrode, and a side surface of the second sub-conductive layer of the first electrode may be aligned with each other. Side surfaces of the main conductive layer of the second electrode are disposed inner than side surfaces of the first sub-conductive layer of the second electrode and side surfaces of the second sub-conductive layer of the second electrode.

The main conductive layer of the first electrode and the main conductive layer of the second electrode may include aluminum, and the first and second sub-conductive layers of the first electrode and the first and second sub-conductive layers of the second electrode may include titanium.

A lower end portion of the main conductive layer of the second electrode may be recessed inward from imaginary side surfaces, which connect the side surfaces of the first sub-conductive layer of the second electrode and the side surfaces of the second sub-conductive layer of the second electrode by a first width, and an upper end portion of the main conductive layer may be recessed inward from the imaginary side surfaces by a second width greater than the first width.

The first width may be in a range of about 0.05 to about 0.15 μm, and the second width may be in a range of about 0.25 μm to about 0.35 μm.

The lower end portion of the main conductive layer of the second electrode may include a tip portion.

The main conductive layer of the first electrode and the main conductive layer of the second electrode may include aluminum. The first and second sub-conductive layers of the first electrode and the first and second sub-conductive layers of the second electrode may include titanium.

According to an embodiment, a method of fabricating a display device may include forming a data conductive layer on a substrate, the data conductive layer including a transistor electrode and an auxiliary electrode, forming a via layer including a contact hole partially exposing the transistor electrode and an opening of the via layer exposing the auxiliary electrode by stacking an organic material layer on the data conductive layer, exposing the organic material layer to light, and by developing the organic material layer using a developer, forming a pixel electrode layer on the via layer, forming a mask pattern on the pixel electrode layer and etching the pixel electrode layer by using the mask pattern, removing the mask pattern by using a stripper including an amine group, and performing a cleaning process by supplying cleaning water in a state where the stripper remains. Each of the transistor electrode and the auxiliary electrode may include a first sub-conductive layer, a main conductive layer, and a second sub-conductive layer that are stacked sequentially.

In case that the organic material layer is developed by using the developer, side surfaces of the main conductive layer of the auxiliary electrode may be initially etched by a first width from side surfaces of the second sub-conductive layer of the auxiliary electrode.

During the cleaning process, the side surfaces of the main conductive layer of the auxiliary electrode may be secondarily etched by a second width greater than the first width.

The first width may be in a range of about 0.05 μm to about 0.15 μm. The second width may be in a range of about 0.25 μm to about 0.35 μm.

The developing of the organic material layer by using the developer may be performed for a first process time for removing the exposed organic material layer and a second process time for initially etching the main conductive layer of the auxiliary electrode. The second process time may be in a range of 15 seconds to 30 seconds and shorter than the first process time.

The developer may include a tetramethylammonium hydroxide solution.

In the performing of the cleaning process, the cleaning water may be provided at a flow rate of 140 liters to 290 liters per minute per unit area ($m^2$), and the cleaning process may be performed for a range of 100 seconds to 300 seconds.

The method may further include depositing an intermediate layer and depositing a common electrode after the performing of the cleaning process. Vertical deposition of a deposition material may be smaller in the depositing of the common electrode than in the depositing of the intermediate layer.

The main conductive layer of the transistor electrode and the main conductive layer of the auxiliary electrode may include aluminum. The first and second sub-conductive layers of the transistor electrode and the first and second sub-conductive layers of the auxiliary electrode may include titanium.

According to an embodiment, a display device may include: a substrate; a thin-film transistor disposed on the substrate, the thin-film transistor including a semiconductor layer; an interlayer insulating layer disposed on the thin-film transistor; a data conductive layer disposed on the interlayer insulating layer and including an auxiliary electrode and a transistor electrode connected to the semiconductor layer of the thin-film transistor, each of the auxiliary electrode and the transistor electrode including: a main conductive layer, and an upper sub-conductive layer disposed on an upper surface of the main conductive layer; a via layer disposed on the data conductive layer; a pixel electrode layer disposed on the via layer, the the pixel electrode layer including: a pixel electrode connected to the transistor electrode through a contact hole penetrating the via layer, and a dummy pixel electrode separated from the pixel electrode, the dummy pixel electrode including: a first dummy pixel electrode disposed adjacent to the auxiliary electrode, and a second dummy pixel electrode disposed on an upper surface of the auxiliary electrode and separated from the first dummy pixel electrode; an intermediate layer disposed on the pixel electrode layer, the intermediate layer including: a first portion disposed adjacent to the auxiliary electrode, and a second portion disposed on the upper surface of the auxiliary electrode and separated from the first portion of the intermediate layer; and a common electrode disposed on the intermediate layer, the common electrode including: a first portion disposed adjacent to the auxiliary electrode, and a second portion disposed on the upper surface of the auxiliary electrode, wherein the auxiliary electrode may have an undercut shape in which side surfaces of the main conductive layer of the auxiliary electrode are disposed inner than side surfaces of the upper sub-conductive layer of the auxiliary electrode, the first portion of the intermediate layer may cover an end portion of the first dummy pixel electrode disposed on a side of the auxiliary electrode, and the first portion of the common electrode may contact a side surface of the main conductive layer of the auxiliary electrode.

The first dummy pixel electrode and the common electrode may not directly contact each other.

The first dummy pixel electrode and the common electrode may be electrically connected through the main conductive layer of the auxiliary electrode.

In a display device according to an embodiment, an auxiliary electrode may be made of a data conductive layer to which a low-resistance metal may be applied, but an undercut shape may be given to the auxiliary electrode. Therefore, it is possible to readily separate an intermediate layer with enabling a stable contact between the auxiliary electrode and a common electrode to reduce the resistance of the common electrode. Accordingly, since a voltage drop due to the resistance of the common electrode is reduced, display quality may be improved.

In a display device according to an embodiment, an undercut shape of an auxiliary electrode may be effectively implemented using a simple method without addition of a complicated process.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which:

FIGS. 12 through 21 are schematic cross-sectional views illustrating steps of a method of fabricating a display device according to an embodiment;

FIG. 25 is a schematic cross-sectional view of a display panel of a display device according to an embodiment.

DETAILED DESCRIPTION OF THE EMBODIMENTS

Figure 1:
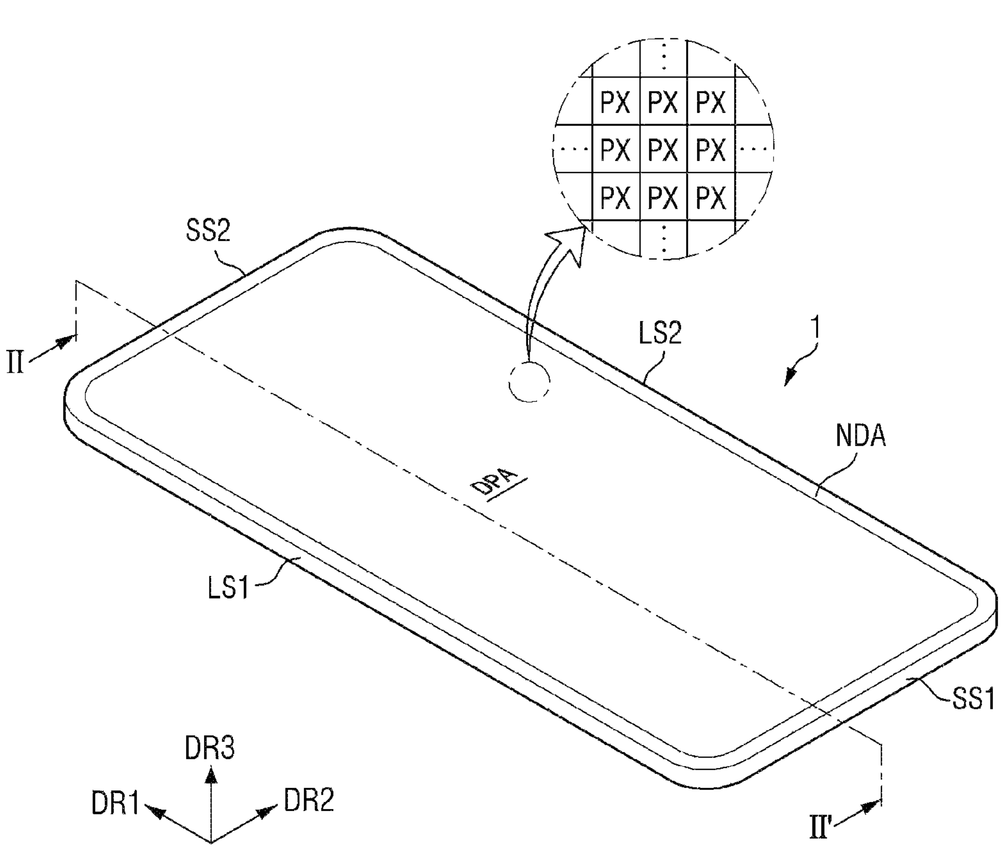
FIG. 1 is a schematic perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic perspective view of a display device 1 according to an embodiment.

In the following embodiments, a first direction DR1 and a second direction DR2 are directions intersecting each other in different directions, for example, directions perpendicularly intersecting each other in a plan view. A third direction DR3 is a direction intersecting a plane defined by the first direction DR1 and the second direction DR2, for example, a direction perpendicularly intersecting both the first direction DR1 and the second direction DR2. However, directions mentioned in embodiments should be understood as relative directions, and embodiments are not limited to the mentioned directions.

Referring to FIG. 1, the display device 1 may display moving images or still images. For example, the display device 1 may include a top emission type display device, a bottom emission type display device, a double-sided emission type display device, and a transparent display device. The top emission type display device may display images through a top side thereof in the third direction DR3. The bottom emission type display device may display images through a bottom side thereof in a direction opposite to the third direction DR3. The double-sided emission type display device and the transparent display device may display images through opposite sides thereof (e.g., top and bottom sides).

The display device 1 may refer to any electronic device including a display screen. Examples of the display device 1 may include a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, a television, a notebook computer, a netbook, a monitor, a billboard, and the Internet of things (IoT), all of which include a display screen. An example in which the display device 1 is applied to a medium-sized portable device such as a tablet PC will be described below.

Referring to FIG. 1, the planar shape of the display device 1 may be a rectangle with rounded corners, and long sides LS1 and LS2 are disposed parallel to the first direction DR1. For descriptive convenience, a long side disposed on a side (e.g., a left side in a plan view) among two facing long sides of the rectangle will be referred to as a first long side LS1, and a long side disposed on another side (e.g., a right side in a plan view) will be referred to as a second long side LS2. For example, a short side disposed on a side (e.g., a lower side in a plan view) among two short sides facing each other will be referred to as a first short side SS1, and a short side disposed on another side (e.g., an upper side in a plan view) will be referred to as a second short side SS2. The terms "the first long side LS1," the second long side LS2," "the first short side SS1," and "the second short side SS2" will be used to refer to corresponding sides of not only the display device 1 but also an element included in the display device 1 in case that the element has a shape and positional relationship similar to those of the display device 1. However, the planar shape of the display device 1 is not limited thereto. For example, the planar shape of the display device 1 may be modified to various shapes such as a rectangle, a square, a rhombus, other polygons, a circle, and an oval according to the field to which the display device 1 is applied.

The display device 1 may include a display area DPA and a non-display area NDA. The display area DPA is an area where a screen is displayed, and the non-display area NDA is an area where no screen is displayed. The non-display area NDA may be disposed around the display area DPA. In case that the display area DPA has a rectangular shape, the non-display area NDA may surround four sides of the display area DPA. However, embodiments are not limited thereto. For example, the non-display area NDA may be disposed outside only some sides of the display area DPA. In some cases, the non-display area NDA may exist inside the display area DPA and may be surrounded by the display area DPA.

Figure 2:
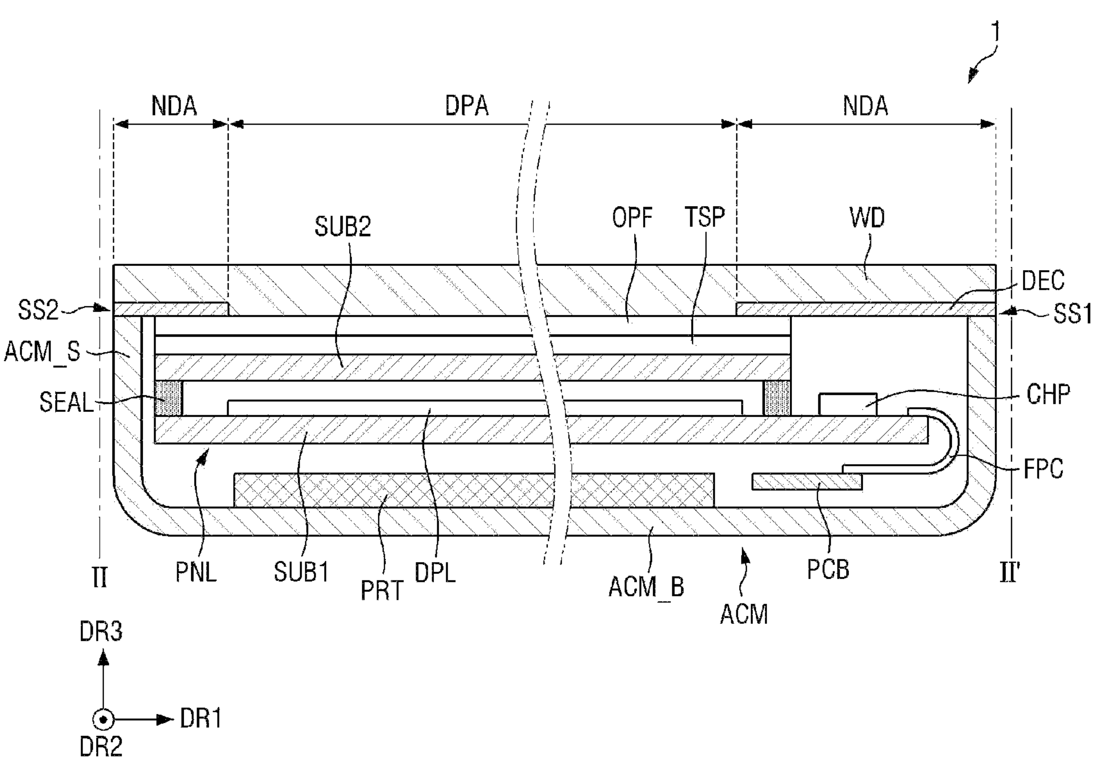
FIG. 2 is a schematic cross-sectional view taken along line II-IF of FIG. 1.

FIG. 2 is a schematic cross-sectional view taken along line II-II' of FIG. 1.

Referring to FIGS. 1 and 2, the display device 1 may include a display panel PNL. The display device 1 may further include a driver connected to the display panel PNL, an accommodating container ACM accommodating the display panel PNL and the driver, and an optical member OPF disposed on the display panel PNL.

The display panel PNL may include a display screen. In the display device 1, the display panel PNL may display images in the third direction DR3 (e.g., an upward direction. The display panel PNL may have a planar shape substantially similar to that of the display device 1.

Examples of the display panel PNL may include an organic light emitting display panel, a micro light emitting diode (LED) display panel, a nano LED display panel, a quantum dot light emitting display panel, a liquid crystal display panel, a plasma display panel, a field emission display panel, an electrophoretic display panel, and an electrowetting display panel. A case where an organic light emitting display panel is applied as an example of the display panel PNL will be described below, but embodiments are not limited to this case, and other various display panels may be applicable.

The display panel PNL may include a first substrate SUB1 and a display layer DPL disposed on the first substrate SUB1. The display panel PNL may further include a second substrate SUB2 facing the first substrate SUB1 and a sealing member SEAL bonding the first substrate SUB1 and the second substrate SUB2 together at edge portions thereof. The second substrate SUB2 may be spaced apart from an upper surface of the display layer DPL. For example, a space between the second substrate SUB2 and the display layer DPL may be an empty space. For example, the space may be filled with a gas such as air, or may be filled with a solid filler. In another example, the second substrate SUB2 and the upper surface of the display layer DPL may contact each other.

The first substrate SUB1 may include a space in which the display layer DPL is disposed. The first substrate SUB1 may be an insulating substrate or a semiconductor substrate. The first substrate SUB1 may be a rigid substrate. For example, the first substrate SUB1 may include glass.

The second substrate SUB2 may be disposed above the display layer DPL to protect the display layer DPL. The second substrate SUB2 may be an encapsulation substrate that prevents moisture permeation or gas inflow. Since the second substrate SUB2 is placed in a display direction of the display layer DPL, a transparent insulating substrate may be formed as the second substrate SUB2. For example, the second substrate SUB2 may include glass.

The sealing member SEAL may be disposed at the edge portions of the first substrate SUB1 and the second substrate SUB2 to bond them together. The sealing member SEAL may have an encapsulation function to prevent moisture permeation or gas inflow in a lateral direction of the display panel PNL. The sealing member SEAL may include, for example, frit, a photocurable resin, or a thermosetting resin.

An inner space defined by the first substrate SUB1, the second substrate SUB2, and the sealing member SEAL may be sealed. The display layer DPL may be disposed in the sealed inner space.

The display layer DPL may be divided into pixels PX in a plan view. The pixels PX may include color pixels. For example, the pixels PX may include red pixels, green pixels, and blue pixels alternately arranged.

The display layer DPL may include a circuit element layer and a light emitting element layer. The circuit element layer and the light emitting element layer may be formed on the first substrate SUB1 or may be separately implemented and then coupled onto the first substrate SUB1. The display layer DPL will be described in detail below.

The driver may drive the operation of the display panel PNL. At least some elements of the driver may drive the pixels PX of the display layer DPL.

The driver may be implemented in the form of a chip, a film, and/or a circuit board. For example, the driver may include a driving chip CHP, a first printed circuit board FPC, and a second printed circuit board PCB. The first printed circuit board FPC may be a flexible printed circuit board, and the second printed circuit board PCB may be a rigid printed circuit board, but embodiments are not limited thereto.

The driving chip CHP and/or the first printed circuit board FPC may be mounted on the first substrate SUB1. For example, each of the driving chip CHP and the first printed circuit board FPC may be connected (or electrically connected) to a pad electrode disposed in the display layer DPL on the first substrate SUB1 through an anisotropic conductive film or ultrasonic bonding. The second printed circuit board PCB may be connected (or electrically connected) to an end of the first printed circuit board FPC. As illustrated in FIG. 2, the first printed circuit board FPC may be bent toward under the first substrate SUB1, and the second printed circuit board PCB coupled to the first printed circuit board FPC may be disposed under the first substrate SUB1.

Although a case where the driving chip CHP is mounted on the first substrate SUB1 is illustrated in FIG. 2, the driving chip CHP may be mounted on the first printed circuit board FPC.

The driving chip CHP and the first printed circuit board FPC may be mounted on an end of the first substrate SUB1. In the first substrate SUB1, an area where the driving chip CHP is mounted (hereinafter, referred to as a mounting area) may be disposed adjacent to the first short side SS1 disposed on one side in the first direction DR1. However, embodiments are not limited thereto, and the mounting area may be disposed adjacent to the long sides LS1 and LS2.

The mounting area of the first substrate SUB1 may be disposed outside the sealing member SEAL. Since the mounting area of the first substrate SUB1 is disposed in the non-display area NDA, the non-display area NDA on the first short side SS1 where the mounting area of the first substrate SUB1 is disposed in the display device 1 may have a relatively greater width than the non-display area NDA on the other sides LS1, LS2, and SS2.

The mounting area of the first substrate SUB1 may not overlap the second substrate SUB2. For example, the first short side SS1 where the mounting area of the first substrate SUB1 is disposed may protrude outward from a corresponding first short side SS1 of the second substrate SUB2. Sides (e.g., LS1, LS2 and SS2) other than the side (e.g., SS1) where the mounting area of the first substrate SUB1 is disposed may be aligned with corresponding sides (e.g., LS1, LS2 and SS2) of the second substrate SUB2 and the sealing member SEAL.

The display device 1 may further include a touch member TSP. The touch member TSP may be formed as a separate film or panel and coupled onto a surface of the second substrate SUB2 of the display panel PNL or may be formed (e.g., directly formed) on the surface of the second substrate SUB2 of the display panel PNL in the form of a layer.

The optical member OPF may be disposed on the display panel PNL. An example of the optical member OPF may be a polarizing member. The polarizing member may reduce reflection of external light. The polarizing member may be formed in the form of a film and coupled onto the display panel PNL. Other examples of the optical member OPF may include a viewing angle control film and a lenticular film for implementing a 3D image. However, embodiments are not limited thereto. The optical member OPF may include two or more members having an optical function.

The display device 1 may further include a window member WD. The window member WD may be disposed on the display panel PNL to protect the display panel PNL from external impact. The window member WD may form the exterior of an upper surface of the display device 1. In case that the display device 1 includes the optical member OPF, the window member WD may be disposed on the optical member OPF. For example, an optical film such as an anti-fingerprint film may be further disposed on the window member WD.

The window member WD may cover the display panel PNL in a plan view. The window member WD may cover not only the second substrate SUB2 but also the first short side SS1 of the first substrate SUB1 protruding from the first short side SS1 of the second substrate SUB2. The window member WD may further include a printed layer DEC disposed along edges thereof. The printed layer DEC may be disposed in the non-display area NDA to form a bezel of the display device 1. Furthermore, the printed layer DEC may function as a decorative layer that enhances the exterior of the display device 1 and may cover a structure thereunder and prevent light leakage.

The accommodating container ACM may be disposed under the display panel PNL to accommodate the display panel PNL, the first printed circuit board FPC, and the second printed circuit board PCB. The accommodating container ACM may include a bottom portion ACM_B and sidewall portions ACM_S extending from edges of the bottom portion ACM_B in the third direction DR3. Upper ends of the sidewall portions ACM_S may be coupled to a lower surface of the window member WD through a coupling member such as an adhesive layer. In a plan view, the sidewall portions ACM_S may be covered (e.g., completely covered) by the window member WD. In another example, the sidewall portions ACM_S may be coupled to side surfaces of the window member WD.

An empty space may be disposed between the bottom portion ACM_B of the accommodating container ACM and the display panel PNL, and components PRT, such as a battery, may be further accommodated in the empty space.

Figure 3:
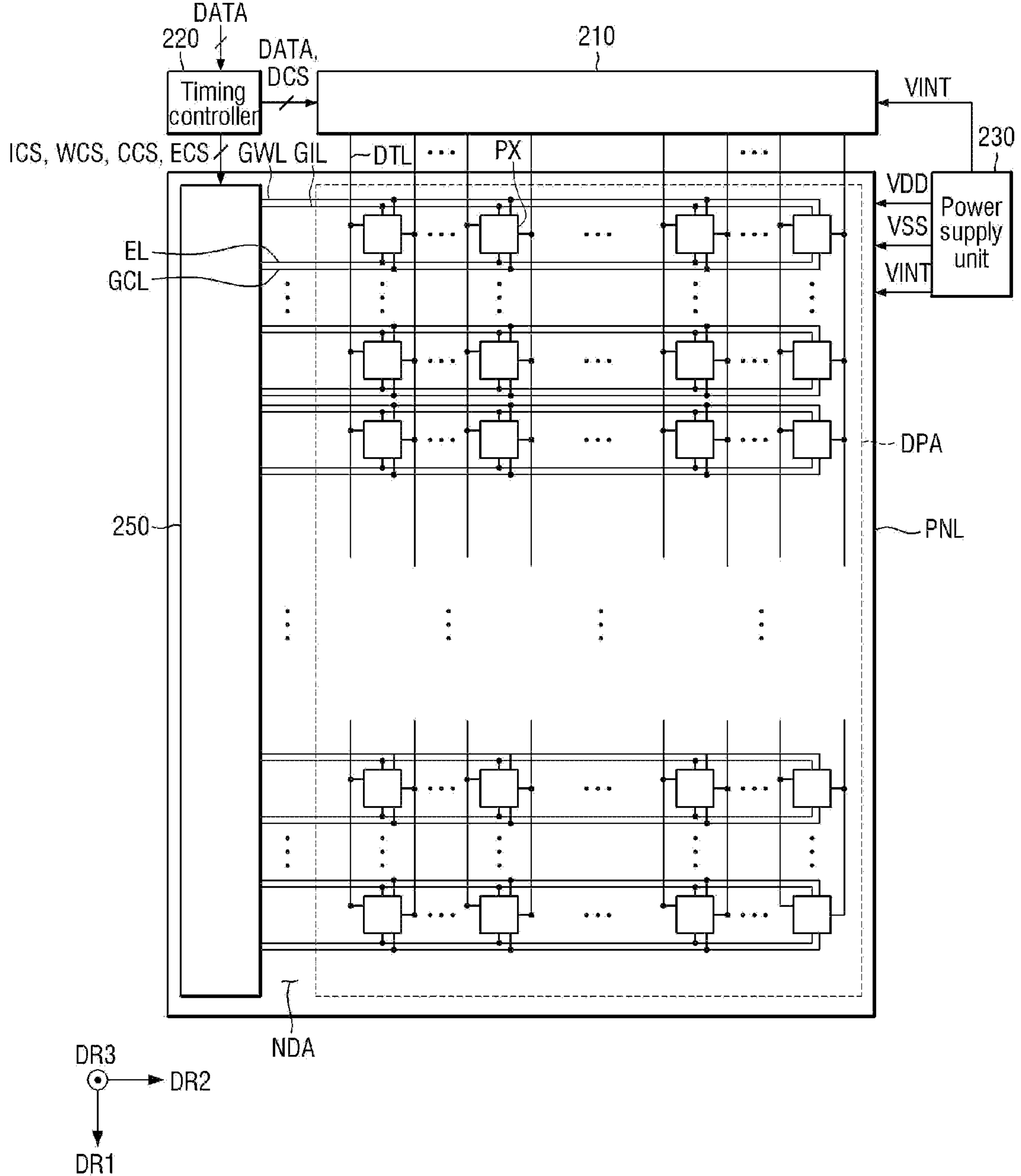
FIG. 3 is a schematic schematic block diagram of the display device according to an embodiment.

FIG. 3 is a schematic block diagram of the display device 1 according to an embodiment.

Referring to FIG. 3, the display area DPA of the display device 1 may include pixels PX arranged in a matrix shape. Drivers may include a display scan driver 250, a data driver 210, a timing controller 220, and a power supply unit 230. Although the drivers are disposed in the non-display area NDA, some of the drivers may be disposed in the display area DPA.

In the display area DPA, not only the pixels PX but also wirings connected to the drivers may be disposed. The wirings may include display write wirings GWL, display initialization wirings GIL, display control wirings GCL, emission wirings EL, and data wirings DTL.

The data wirings DTL may extend in the first direction DR1. The display write wirings GWL, the display initialization wirings GIL, the display control wirings GCL, and the emission wirings EL may extend in the second direction DR2.

Each of the pixels PX may be connected to any one of the display write wirings GWL, any one of the display initialization wirings GIL, any one of the display control wirings GCL, and any one of the emission wirings EL. Each of the pixels PX may receive a data voltage of a data wiring DTL according to a display write signal of a display write wiring GWL, a display initialization signal of a display initialization wiring GIL, a display control signal of a display control wiring GCL and an emission signal of an emission wiring EL and may emit light by supplying a driving current to a light emitting element according to the data voltage.

The display scan driver 250 may be connected to the display write wirings GWL, the display initialization wirings GIL, the display control wirings GCL, and the emission wirings EL. The display scan driver 250 may include a display signal output unit outputting display write signals transmitted to the display write wirings GWL, display initialization signals transmitted to the display initialization wirings GIL and display control signals transmitted to the display control wirings GCL and an emission signal output unit outputting emission signals transmitted to the emission wirings EL.

The display scan driver 250 may receive a write control signal WCS, an initialization control signal ICS, a scan control signal CCS, and an emission control signal ECS from the timing controller 220. The display signal output unit of the display scan driver 250 may generate display write signals according to the write control signal SCS and output the display write signals to the display write wirings GWL. For example, the display signal output unit of the display scan driver 250 may generate display initialization signals according to the initialization control signal ICS and output the display initialization signals to the display initialization wirings GIL. For example, the display signal output unit of the display scan driver 250 may generate display control signals according to the scan control signal CCS and output the display control signals to the display control wirings GCL. Furthermore, the emission signal output unit of the display scan driver 250 may generate emission signals according to the emission control signal ECS and output the emission signals to the emission wirings EL.

The data driver 210 may convert the digital video data DATA into data voltages and may output the data voltages to the data wirings DTL. The data driver 210 may output the data voltages in synchronization with the display write signals. Pixels PX may be selected by the display write signals of the display scan driver 250, and the data voltages may be supplied to the selected pixels PX, respectively.

The timing controller 220 may receive the digital video data DATA and timing signals from an external graphics device. For example, the external graphics device may be a graphic card of a computer or a set-top box. However, embodiments are not limited thereto.

The timing controller 220 may generate the write control signal WCS, the initialization control signal ICS, the scan control signal CCS, and the emission control signal ECS for controlling the operation timing of the display scan driver 250 according to the timing signals. For example, the timing controller 220 may generate a data control signal DCS for controlling the operation timing of the data driver 210 according to the timing signals.

The timing controller 220 may output the write control signal WCS, the initialization control signal ICS, the scan control signal CCS, and the emission control signal ECS to the display scan driver 250. The timing controller 220 may output the digital video data DATA and the data control signal DCS to the data driver 210.

The power supply unit 230 may generate driving voltages and output the driving voltages to the display area DPA. The power supply unit 230 may output a first driving voltage VDD, a second driving voltage VSS, and a third driving voltage VINT to the display panel PNL. The first driving voltage VDD may be a high potential driving voltage, the second driving voltage VSS may be a low potential driving voltage, and the third driving voltage VINT may be a voltage for initializing a gate electrode of a driving transistor of each pixel PX.

Figure 4:
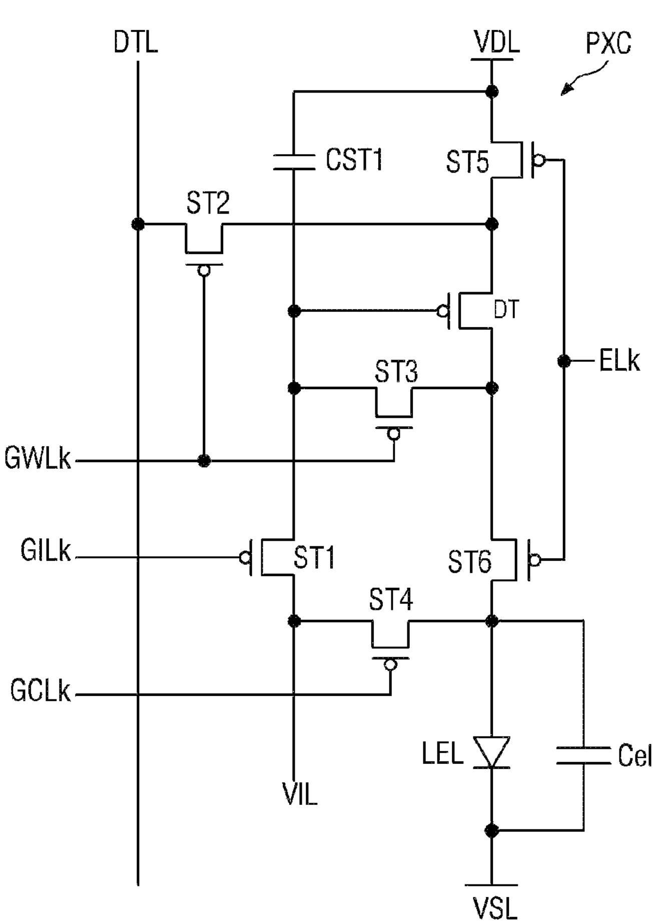
FIG. 4 is a schematic diagram of an equivalent circuit of a pixel according to an embodiment.

FIG. 4 is a schematic diagram of an equivalent circuit of a pixel PX according to an embodiment.

Referring to FIG. 4, the pixel PX according to an embodiment may be connected to a $k^{th}$ display initialization wiring GILk (where k is a positive integer), a $k^{th}$ display write wiring GWLk, and a $k^{th}$ display control wiring GCLk. For example, the pixel PX may be connected to a first driving voltage wiring VDL to which the first driving voltage VDD is supplied, a second driving voltage wiring VSL to which the second driving voltage VSS is supplied, and a third driving voltage wiring VIL to which the third driving voltage VINT is supplied.

A pixel circuit PXC may include a driving transistor DT, switch elements, and a capacitor CST1. The switch elements include first through sixth transistors ST1 through ST6.

The driving transistor DT may include a gate electrode, a first electrode, and a second electrode. The driving transistor DT may control a drain-source current Ids (hereinafter, referred to as a "driving current") flowing between the first electrode and the second electrode according to a data voltage applied to the gate electrode thereof. The driving current Ids flowing through a channel of the driving transistor DT may be proportional to the square of a difference between a voltage Vgs between the first electrode and the gate electrode of the driving transistor DT and a threshold voltage as shown in Equation 1.

$$Ids=k'\times(Vsg-Vth)^2 \quad \text{[Equation 1]}$$

In Equation 1, k' is a proportional coefficient determined by the structure and physical characteristics of the driving transistor DT, Vsg is a voltage between the first electrode and the gate electrode of the driving transistor DT, and Vth is the threshold voltage of the driving transistor DT.

A light emitting element LEL may emit light according to the driving current Ids. The amount of light emitted from the light emitting element LEL may increase as the driving current Ids increases.

The light emitting element LEL may be an organic light emitting diode including an organic light emitting layer disposed between an anode and a cathode thereof. In another example, the light emitting element LEL may be an inorganic light emitting element including an inorganic semiconductor disposed between an anode and a cathode thereof. In another example, the light emitting element LEL may be a quantum dot light emitting element including a quantum dot light emitting layer disposed between an anode and a cathode thereof. In another example, the light emitting element LEL may be a micro-light emitting element including a micro-light emitting diode disposed between an anode and a cathode thereof.

The anode of the light emitting element LEL may be connected to a first electrode of a fourth transistor ST4 and a second electrode of a sixth transistor ST6, and the cathode of the light emitting element LEL may be connected to the second driving voltage wiring VSL. A parasitic capacitance Cel may be formed between the anode and the cathode of the light emitting element LEL.

A first transistor ST1 may be turned on by an initialization scan signal of the $k^{th}$ display initialization wiring GILk to connect the gate electrode of the driving transistor DT to the third driving voltage wiring VIL. Accordingly, the third driving voltage VINT of the third driving voltage wiring VIL may be applied to the gate electrode of the driving transistor DT. The first transistor ST1 may have a gate electrode connected to the $k^{th}$ display initialization wiring GILk, a first electrode connected to the gate electrode of the driving transistor DT, and a second electrode connected to the third driving voltage wiring VIL.

A second transistor ST2 may be turned on by a display write signal of the $k^{th}$ display write wiring GWLk to connect the first electrode of the driving transistor DT to a data wiring DTL. Accordingly, a data voltage of the data wiring DTL may be applied to the first electrode of the driving transistor DT. The second transistor ST2 may have a gate electrode connected to the $k^{th}$ display write wiring GWLk, a first electrode connected to the first electrode of the driving transistor DT, and a second electrode connected to the data wiring DTL.

A third transistor ST3 may be turned on by the display write signal of the $k^{th}$ display write wiring GWLk to connect the gate electrode and the second electrode of the driving transistor DT. In case that the gate electrode and the second electrode of the driving transistor DT are connected, the driving transistor DT may be driven as a diode. The third transistor ST3 may have a gate electrode connected to the $k^{th}$ display write wiring GWLk, a first electrode connected to the second electrode of the driving transistor DT, and a second electrode connected to the gate electrode of the driving transistor DT.

The fourth transistor ST4 may be turned on by a display control signal of the $k^{th}$ display control wiring GCLk to connect the anode of the light emitting element LEL to the third driving voltage wiring VIL. The third driving voltage VINT of the third driving voltage wiring VIL may be applied to the anode of the light emitting element LEL. The fourth transistor ST4 may include a gate electrode connected to the $k^{th}$ display control wiring GCLk, the first electrode connected to the anode of the light emitting element LEL, and a second electrode connected to the third driving voltage wiring VIL.

A fifth transistor ST5 may be turned on by an emission signal of a $k^{th}$ emission wiring Elk to connect the first electrode of the driving transistor DT to the first driving voltage wiring VDL. The fifth transistor ST5 may include a gate electrode connected to the $k^{th}$ emission wiring Elk, a first electrode connected to the first driving voltage wiring VDL, and a second electrode connected to the first electrode of the driving transistor DT.

The sixth transistor ST6 may be disposed between the second electrode of the driving transistor DT and the anode of the light emitting element LEL. The sixth transistor ST6 may be turned on by the emission signal of the $k^{th}$ emission wiring Elk to connect the second electrode of the driving transistor DT to the anode of the light emitting element LEL. The sixth transistor ST6 may include a gate electrode connected to the $k^{th}$ emission wiring Elk, a first electrode connected to the second electrode of the driving transistor DT, and a second electrode connected to the anode of the light emitting element LEL.

In case that both the fifth transistor ST5 and the sixth transistor ST6 are turned on, the driving current Ids of the driving transistor DT according to the data voltage applied to the gate electrode of the driving transistor DT may flow to the light emitting element LEL.

The capacitor CST1 may be formed between the gate electrode of the driving transistor DT and the first driving voltage wiring VDL. The capacitor CST1 may include a first capacitor electrode connected to the gate electrode of the driving transistor DT and a second capacitor electrode connected to the first driving voltage wiring VDL.

In case that the first electrode of each of the first through sixth transistors ST1 through ST6 and the driving transistor DT is a source electrode, the second electrode may be a drain electrode. In another example, in case that the first electrode of each of the first through sixth transistors ST1 through ST6 and the driving transistor DT is a drain electrode, the second electrode may be a source electrode. The terms "source electrode" and "drain electrode" may be changed according to the movement direction of carriers of a semiconductor layer. The first and second electrodes of the first through sixth transistors ST1 through ST6 and the driving transistor DT may be referred to as source/drain electrodes. In case that the first electrode and the second electrode need to be distinguished from each other, the first electrode and the second electrode may be referred to as a first source/drain electrode and a second source/drain electrode.

An active layer of each of the first through sixth transistors ST1 through ST6 and the driving transistor DT may be made of any one of polysilicon, amorphous silicon, and an oxide semiconductor. Although the first through sixth transistors ST1 through ST6 and the driving transistor DT are mainly described as P-type metal oxide semiconductor field effect transistors (MOSFETs) in FIG. 4, embodiments are not limited thereto. For example, the first through sixth transistors ST1 through ST6 and the driving transistor DT may be formed as N-type MOSFETs. In another example, at least one of the first through sixth transistors ST1 through ST6 may be formed as an N-type MOSFET.

In the above embodiment, a case where the pixel circuit PXC adopts a 7T-1C structure including seven transistors and one capacitor has been described. However, the number of transistors and capacitors constituting the pixel circuit PXC may be variously modified.

Referring to FIGS. 3 and 4, the anode of the light emitting element LEL may be formed as a pixel electrode that is separate for each pixel PX and connected to a different driving transistor DT to receive a voltage and/or a current. However, the cathode of the light emitting element LEL may be formed as a common electrode connected as a whole regardless of the pixels PX. The common electrode may be in the form of a whole surface electrode disposed on the entire surface of the first substrate SUB1 (see FIG. 2). The common electrode may receive the second driving voltage VSS through the second driving voltage wiring VSL.

In some embodiments, the first driving voltage wiring VDL or the third driving voltage wiring VIL may extend across the display area DPA in the shape of lines to be connected to each pixel circuit PXC, but the second driving voltage wiring VSL may extend along the non-display area NDA around the display area DPA. The common electrode may extend to the non-display area NDA to at least partially overlap the second driving voltage wiring VSL. The common electrode may be connected (e.g., electrically connected) to the second driving voltage wiring VSL through a contact hole in an area overlapping the second driving voltage wiring VSL to receive the second driving voltage VSS. However, since a point or area where the common electrode is connected (e.g., electrically connected) to the second driving voltage wiring VSL is limited to the non-display area NDA, a phenomenon (e.g., an IR drop phenomenon) in which the magnitude of the second driving voltage VSS decreases as the distance from the second driving voltage wiring VSL increases may occur due to the resistance of the common electrode. A voltage drop may occur in other wirings. However, in case that light transmittance is required of the common electrode, a light-transmitting conductive material (such as ITO) applied to the common electrode may have greater resistance than other wirings, thereby increasing the voltage drop phenomenon.

In order to reduce the voltage drop phenomenon of the common electrode, an auxiliary electrode is introduced as will be described in detail below. The auxiliary electrode may be connected (e.g., electrically connected) to the common electrode to reduce the resistance of the common electrode. Since the second driving voltage VSS is provided (e.g., directly provided) to the auxiliary electrode, a voltage drop of the common electrode may be significantly reduced. However, in case that the second driving voltage VSS is not provided, the auxiliary electrode may reduce the resistance of the common electrode only by being connected (e.g., electrically connected) to the common electrode. Therefore, the auxiliary electrode may help to reduce the voltage drop phenomenon. The auxiliary electrode may be disposed across the display area DPA in a line type and connected (e.g., electrically connected) to the common electrode in the display area DPA. Therefore, the auxiliary electrode may lower the resistance of the common electrode in the display area DPA where a voltage drop is likely to occur, because the display area DPA is far away from the second driving voltage wiring VSL disposed in the non-display area NDA.

Figure 5:
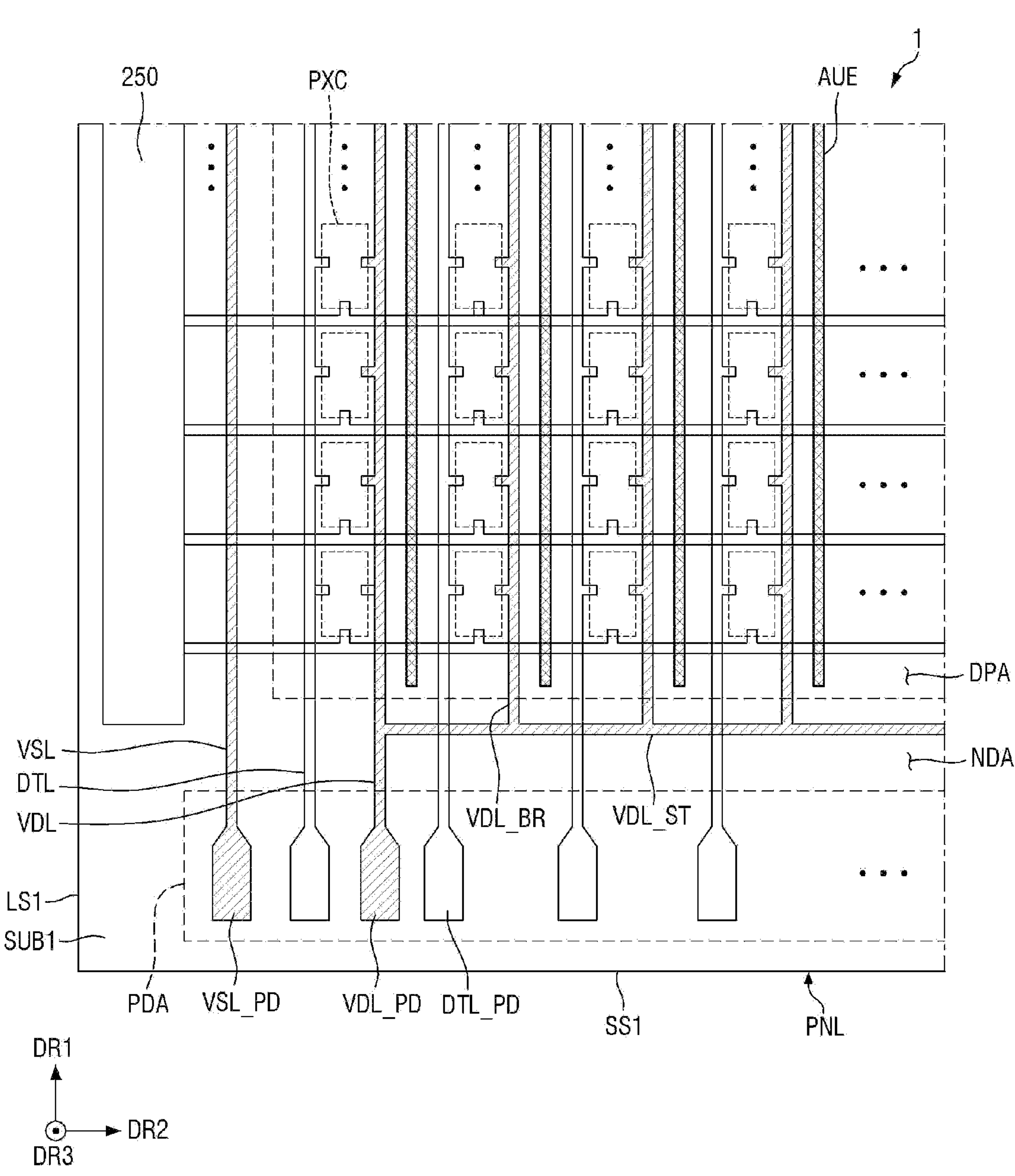
FIG. 5 is a schematic partial layout view of a display panel of the display device according to an embodiment.

FIG. 5 is a schematic partial layout view of the display panel PNL of the display device 1 according to an embodiment. In FIG. 5, the arrangement of the display write wirings GWL, the data wirings DTL, the first driving voltage wiring VDL, the second driving voltage wiring VSL, and auxiliary electrodes AUE among wirings or electrodes is mainly illustrated for convenience of description.

Referring to FIG. 5, a pad area PDA may be disposed in the non-display area NDA adjacent to the first short side SS1 of the first substrate SUB1. Pad electrodes may be disposed in the pad area PDA. The pad electrodes include data pads DTL_PD, at least one first driving voltage pad VDL_PD, and at least one second driving voltage pad VSL_PD.

The data wirings DTL may be respectively connected to the data pads DTL_PD and extend toward the display area DPA. The data wirings DTL may extend in the first direction DR1 and may be disposed between columns of the pixels PX. The data wirings DTL may be connected to pixel circuits PXC disposed around them along their extending direction. One data wiring DTL may be disposed between every two columns of the pixels PX. However, embodiments are not limited thereto, and data wirings DTL may be disposed side by side between one pair of the columns of the pixels PX, and the data wirings DTL may not be disposed between some columns of the pixels PX.

The first driving voltage wiring VDL may be connected to the first driving voltage pad VDL_PD. The first driving voltage wiring VDL may include a stem wiring VDL_ST connected to the first driving voltage pad VDL_PD and branch wirings VDL_BR branching (or extending) from the stem wiring VDL_ST. Each branch wiring VDL_BR may be connected (e.g., electrically connected) to the stem wiring VDL_ST. For example, each branch wiring VDL_BR may extend toward the display area DPA along the second direction DR2 and may be disposed between the columns of the pixels PX. The branch wirings VDL_BR may be connected to the pixel circuits PXC disposed around the branch wirings VDL_BR along their extending direction.

The second driving voltage wiring VSL may be connected to the second driving voltage pad VSL_PD. The second driving voltage wiring VSL may extend in the second direction DR2 along the non-display area NDA adjacent to the first long side LS1 and/or the second long side LS2 of the display panel PNL. The second driving voltage wiring VSL may not extend to the display area DPA.

The auxiliary electrodes AUE may extend along the first direction DR1. The auxiliary electrodes AUE may be disposed between the columns of the pixels PX. In an embodiment, one auxiliary electrode AUE may be disposed between every two columns of the pixels PX, but embodiments are not limited thereto. For example, auxiliary electrodes AUE may be disposed side by side between one pair of the columns of the pixels PX. For another example, one auxiliary electrode AUE may be disposed in each space between the columns of the pixels PX.

The auxiliary electrodes AUE may not be connected (e.g., directly connected) to the pads disposed in the pad area PDA. For example, the auxiliary electrodes AUE may be connected (e.g., electrically connected) to the common electrode disposed thereon as will be described below. Since the common electrode is connected (e.g., electrically connected) to the second driving voltage wiring VSL, the auxiliary electrodes AUE may be connected (e.g., electrically connected) to the second driving voltage pad VSL_PD via the common electrode and the second driving voltage wiring VSL.

The display write wirings GWL may extend in the second direction DR2. In the display area DPA, the display write wirings GWL may intersect the data wirings DTL, the first driving voltage wiring VDL, and the auxiliary electrodes AUE. However, since the display write wirings GWL are made of a different conductive layer from the data wirings DTL, the first driving voltage wiring VDL and the auxiliary electrodes AUE with an insulating layer interposed therebetween, an insulation property without a short circuit may be maintained or secured.

The display scan driver 250 may be disposed on the first long side LS1 and/or the second long side LS2 of the display panel PNL. The display scan driver 250 may be a circuit formed (e.g., directly formed) on the first substrate SUB1. However, embodiments are not limited thereto, and the display scan driver 250 may be implemented and mounted in the form of a chip.

In the illustrated example, the display scan driver 250 may be disposed outside the second driving voltage wiring VSL, and the display write wirings GWL may overlap and cross the second driving voltage wiring VSL. However, the positional relationship between the display scan driver 250 and the second driving voltage wiring VSL is not limited thereto.

Figure 6:
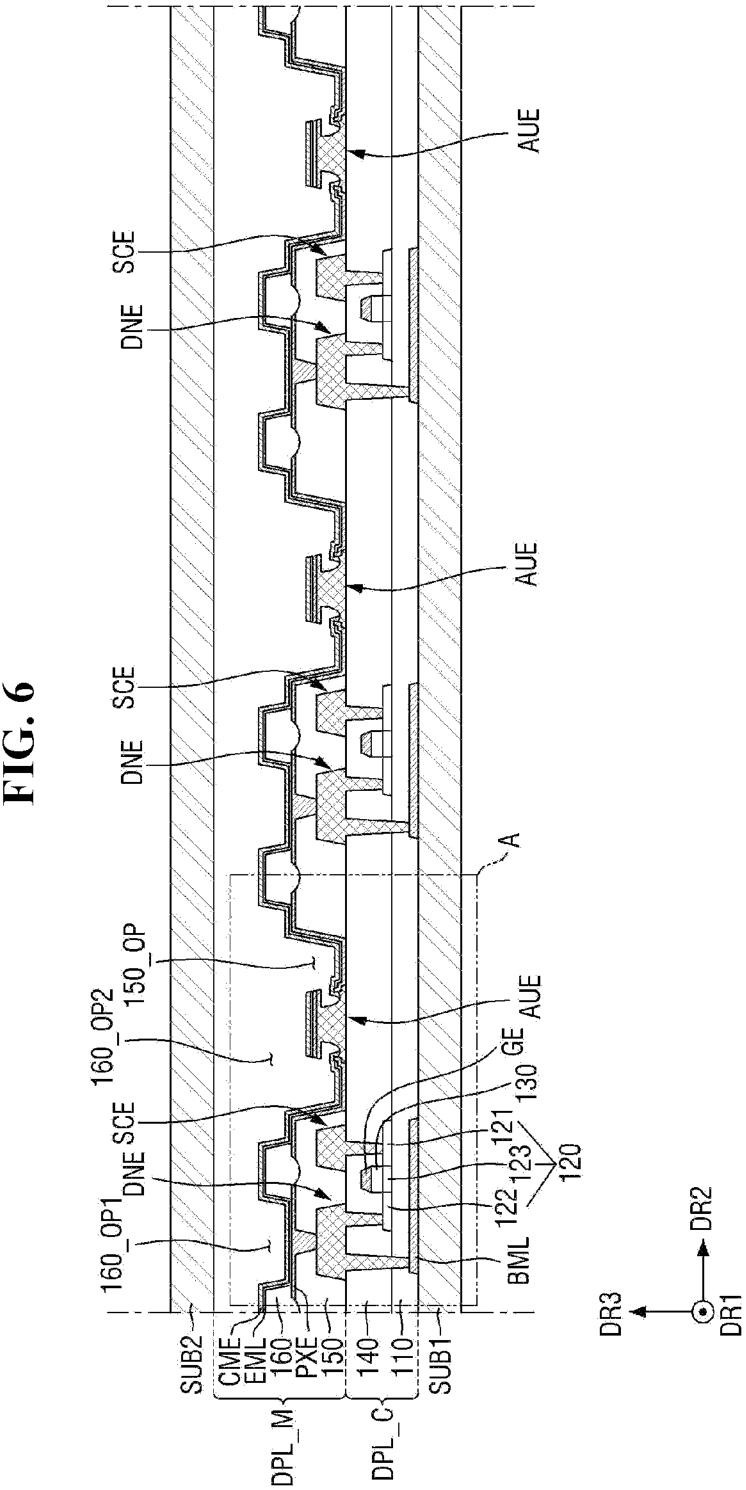
FIG. 6 is a schematic cross-sectional view illustrating the pixel structure of the display panel of the display device according to an embodiment.
Figure 7:
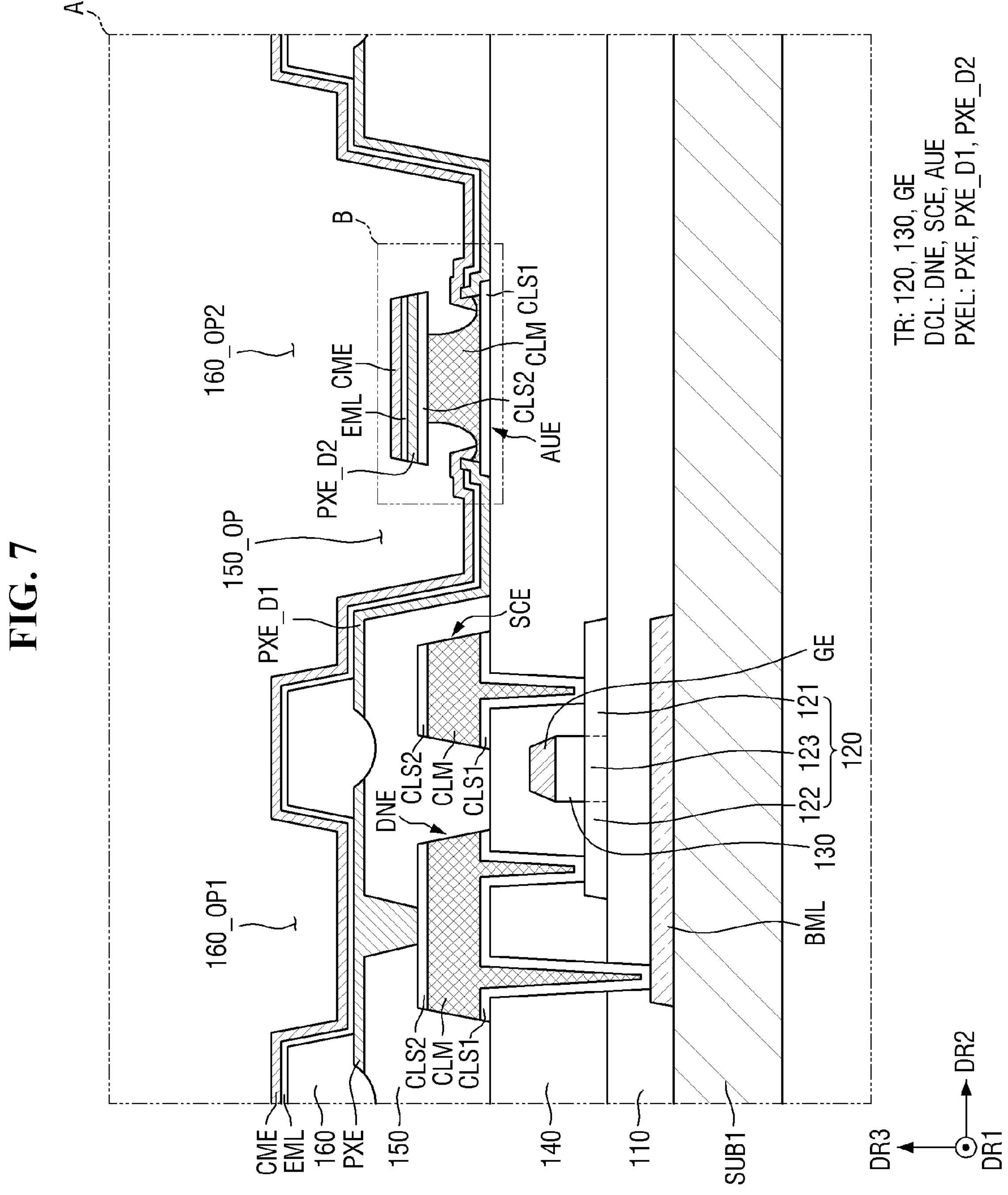
FIG. 7 is a schematic view of area A of FIG. 6.

FIG. 6 is a schematic cross-sectional view illustrating the pixel structure of the display panel PNL of the display device 1 according to an embodiment. FIG. 7 is a schematic enlarged view of area A of FIG. 6.

Referring to FIGS. 6 and 7, as described above, the display layer DPL of the display panel PNL may include a circuit element layer DPL_C and a light emitting element layer DPL_M. The circuit element layer DPL_C may include various wirings, electrodes, and transistors TR. The light emitting element layer DPL_M may be disposed on the circuit element layer DPL_C and may include pixel electrodes PXE, an intermediate layer EML, and a common electrode CME. In the display layer DPL, the circuit element layer DPL_C and the light emitting element layer DPL_M may not need to be distinguished from each other according to a strict standard but may be conveniently distinguished and referred to according to their functions and positions.

In FIG. 7, the shape of a thin-film transistor TR among thin-film transistors TR included in the circuit element layer DPL_C and the connection relationship of the thin-film transistor TR are illustrated for convenience of description. The illustrated thin-film transistor TR may correspond to, for example, the driving transistor DT of FIG. 4. However, the illustrated connection relationship of the thin-film transistor TR is only a possible connection relationship of the thin-film transistor TR illustrated for convenience, and a specific connection relationship of the thin-film transistor TR may not exactly match that of the driving transistor DT illustrated in FIG. 4. Except for the connection relationship of the thin-film transistor TR, other transistors ST1 through ST6 of FIG. 4 may have substantially the same stacked structure as the thin-film transistor TR illustrated in FIG. 7. Referring to FIG. 7, the thin-transistor TR may include a semiconductor layer 120, a gate insulating layer 130, and a gate electrode GE. For example, the semiconductor layer 120 of the thin-transistor TR may include a first region 121, a second region 122, and a channel region 123 disposed between the first region 121 and the second region 122. The first region 121 may be a source region, and the second region 122 may be a drain region, and vice versa.

First, the circuit element layer DPL_C will be described in detail. Bottom metal layers BML may be disposed on the first substrate SUB1. Each of the bottom metal layers BML may have a patterned shape and may overlap the semiconductor layer 120 of the thin-film transistor TR thereon to function as a light-blocking metal layer that prevents light transmitting from below the bottom metal layer BML from entering the semiconductor layer 120. Each of the bottom metal layer BML may be connected (e.g., electrically connected) to one electrode, for example, a drain electrode DNE. The bottom metal layers BML may be omitted.

A buffer layer 110 may be disposed on the bottom metal layers BML. The buffer layer 110 may be formed over the entire surface of the first substrate SUB1. The buffer layer 110 may function to insulate the semiconductor layers 120 from the bottom metal layers BML. The buffer layer 110 may include silicon nitride, silicon oxide, or silicon oxynitride.

The semiconductor layers 120 may be disposed on the buffer layer 110. As described above, the semiconductor layers 120 may overlap the bottom metal layers BML thereunder in the third direction DR3 (e.g., in a thickness direction).

The semiconductor layers 120 may include polycrystalline silicon. In an embodiment, the semiconductor layers 120 may include monocrystalline silicon, low-temperature polycrystalline silicon, amorphous silicon, or an oxide semiconductor. The oxide semiconductor may include, for example, a binary compound (Abx), a ternary compound (AbxCy) or a quaternary compound (AbxCyDz) containing indium, zinc, gallium, tin, titanium, aluminum, hafnium (Hf), zirconium (Zr), magnesium (Mg), etc. In an embodiment, the semiconductor layers 120 may include ITZO (an oxide including indium, tin, and zinc) or IGZO (an oxide including indium, gallium, and tin).

The gate insulating layer 130 of the thin-film transistor TR may be disposed on each of the semiconductor layers 120. The gate insulating layer 130 may include a silicon compound, a metal oxide, or the like. For example, the gate insulating layer 130 may include silicon oxide, silicon nitride, silicon oxynitride, aluminum oxide, tantalum oxide, hafnium oxide, zirconium oxide, titanium oxide, or the like. These materials may be used alone or in combination with each other. The gate insulating layer 130 may be a single layer or a multilayer including stacked layers of different materials.

The gate insulating layer 130 may be disposed on a region of each of the semiconductor layers 120. For example, the gate insulating layer 130 may be disposed on the channel region 123 of each of the semiconductor layers 120 but may expose the first region 121 and the second region 122 of the thin-film transistor TR. For example, the gate insulating layer 130 may overlap the channel region 123 but may not overlap the first region 121 and the second region 122 of the thin-film transistor TR. The gate insulating layer 130 may have substantially the same planar shape as the gate electrode GE of the thin-film transistor TR thereon.

For another example, the gate insulating layer 130 may be disposed on the entire surface of the first substrate SUB1. For example, the gate insulating layer 130 may cover the first region 121 and the second region 122 of each semiconductor layer 120 of a thin-film transistor TR but may include contact holes exposing the first region 121 and the second region 122 so that a source electrode SCE and the drain electrode DNE may contact the semiconductor layer 120.

A gate conductive layer may be disposed on the gate insulating layer 130. The gate conductive layer may include the gate electrodes GE of the thin-film transistors TR. For example, the gate conductive layer may include scan wirings connected to the gate electrodes GE. For example, the display write wirings GWL, the display initialization wirings GIL, the display control wirings GCL, and the emission wirings EL illustrated in FIG. 3 may be made of the gate conductive layer.

Each of the gate electrodes GE may at least partially overlap the channel region 123 of a semiconductor layer 120.

The gate conductive layer may include one or more metals selected from molybdenum (Mo); aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and a combination thereof. In an embodiment, the gate conductive layer may be a stacked layer of Mo/MoN.

An interlayer insulating layer 140 may be disposed on the gate conductive layer. The interlayer insulating layer 140 may include at least one of an inorganic layer including an inorganic insulating material, an organic layer including an organic insulating material, and an organic/inorganic composite layer including an inorganic insulating material and an organic insulating material. Examples of the inorganic insulating material may include silicon oxide, silicon nitride, silicon oxynitride, hafnium oxide, aluminum oxide, titanium oxide, tantalum oxide, and zinc oxide. Examples of the organic insulating material may include polyacrylates resin, epoxy resin, phenolic resin, polyamides resin, polyimides rein, unsaturated polyesters resin, polyphenylenethers resin, polyphenylenesulfides resin, and benzocyclobutene (BCB).

The interlayer insulating layer 140 may have a structure in which two or more layers selected from inorganic layers, organic layers, and organic/inorganic composite layers are stacked. In the drawings, an example in which one inorganic layer is formed as the interlayer insulating layer 140 is illustrated.

A data conductive layer DCL may be disposed on the interlayer insulating layer 140. The data conductive layer DCL may include the source electrodes SCE, the drain electrodes DNE, and the auxiliary electrodes AUE. The data conductive layer DCL may further include the data wirings DTL illustrated in FIG. 3 and the first driving voltage wiring VDL. For example, the data conductive layer DCL may further include the second driving voltage wiring VSL and the third driving voltage wiring VIL. For example, the source electrodes SCE and the drain electrodes DNE may be transistor electrodes.

The source electrode SCE and the drain electrode DNE may be connected (e.g., electrically connected) to the first region 121 and the second region 122 of a semiconductor layer 120 of each thin-film transistor TR through contact holes penetrating the interlayer insulating layer 140. For example, the drain electrode DNE connected to the second region 122 of each thin-film transistor TR may be connected (e.g., electrically connected) to a bottom metal layer BML through a contact hole penetrating the interlayer insulating layer 140 and the buffer layer 110.

The data conductive layer DCL may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and a combination thereof.

The data conductive layer DCL may be a multilayer. For example, the data conductive layer DCL may include a main conductive layer CLM and may further include sub-conductive layers CLS1 and CLS2 disposed under and/or on the main conductive layer CLM.

For example, the data conductive layer DCL may include a first sub-conductive layer CLS1, the main conductive layer CLM disposed on the first sub-conductive layer CLS1, and a second sub-conductive layer CLS2 disposed on the main conductive layer CLM. The first sub-conductive layer CLS1 may be a lower sub-conductive layer disposed on a bottom surface of the main conductive layer CLM, and the second sub-conductive layer CLS2 may be an upper sub-conductive layer disposed on a top surface of the main conductive layer CLM.

The main conductive layer CLM may be a main conductive layer that performs signal transmission. For example, the main conductive layer CLM may include a material having lower resistivity than those of the first sub-conductive layer CLS1 and the second sub-conductive layer CLS2 and may have a greater thickness.

The first sub-conductive layer CLS1 may function as a barrier that prevents impurities, ions, moisture, etc., from the interlayer insulating layer 140 or other structures thereunder from permeating into the main conductive layer CLM. For example, the first sub-conductive layer CLS1 may have greater adhesion to the interlayer insulating layer 140 than the main conductive layer CLM, thereby increasing the adhesion of the data conductive layer DCL.

The second sub-conductive layer CLS2 may function as a barrier layer and/or a capping layer that protects the main conductive layer CLM from chemicals used in a process performed after lamination of the main conductive layer CLM or from impurities, ions, moisture, etc. permeated from structures and other elements on the second sub-conductive layer CLS2.

In an embodiment, the main conductive layer CLM may include aluminum, and the first sub-conductive layer CLS1 and the second sub-conductive layer CLS2 may include titanium. For example, the data conductive layer DCL may have a three-layer layer structure of Ti/Al/Ti. For another example, the data conductive layer DCL may have a three-layer structure such as Mo/Al/Mo or Mo/AlGe/Mo. For example, at least one of the main conductive layer CLM, the first sub-conductive layer CLS1, and the second sub-conductive layer CLS2 may be composed of two or more conductive layers.

The lower surface of the main conductive layer CLM may contact (e.g., directly contact) an upper surface of the first sub-conductive layer CLS1, and the upper surface of the main conductive layer CLM may contact (e.g., directly contact) a lower surface of the second sub-conductive layer CLS2.

In an embodiment, only the first sub-conductive layer CLS1 and the main conductive layer CLM may be disposed in a contact portion of the data conductive layer DCL disposed inside each contact hole of the interlayer insulating layer 140. For example, the second sub-conductive layer CLS2 disposed on the main conductive layer CLM filling each contact hole may not be disposed inside the contact hole. However, embodiments are not limited thereto. In case that the contact holes are wide, a portion of the second sub-conductive layer CLS2 may be disposed inside each contact hole, because the main conductive layer CLM may not completely fill the contact hole.

The first sub-conductive layer CLS1, the main conductive layer CLM, and the second sub-conductive layer CLS2 may have substantially the same pattern shape in a plan view. Here, the phrase "substantially the same pattern shape" includes not only a case where sizes of patterns are completely the same, but also a case where the sizes of the patterns are slightly different but the overall extending shapes of the patterns in a plan view are the same.

Side surfaces of the first sub-conductive layer CLS1, the main conductive layer CLM, and the second sub-conductive layer CLS2 may be substantially aligned with each other in a schematic cross-sectional view taken in the second direction DR2 (e.g., a width direction of the data conductive layer DCL, such as the source electrodes SCE or the drain electrodes DNE of the thin-film transistors TR). Here, in case that side surfaces of conductive layers are aligned with each other, it may not mean that widths of the conductive layers completely overlap each other in a plan view. For example, in case that the side surfaces of the data conductive layer DCL have the inclination at a substantially acute angle as illustrated by the source electrodes SCE and the drain electrodes DNE of FIGS. 6 and 7, the side surfaces of the first sub-conductive layer CLS1, the main conductive layer CLM, and the second sub-conductive layer CLS2 may be seen as being substantially aligned with each other in case that they lie on a plane inclined at an acute angle. The data wirings DTL, the first driving voltage wiring VDL, and the second driving voltage wiring VSL may have the same cross-sectional shape as the source electrodes SCE or the drain electrodes DNE.

In the auxiliary electrodes AUE, the side surfaces of the main conductive layer CLM may be disposed inner than the side surfaces of the first sub-conductive layer CLS1 and the second sub-conductive layer CLS2. For example, the side surfaces of the main conductive layer CLM may be recessed inside between the side surfaces of the first sub-conductive layer CLS1 and the second sub-conductive layer CLS2. For example, a width of the main conductive layer CLM of each auxiliary electrode AUE may be smaller than widths of the first sub-conductive layer CLS1 and the second sub-conductive layer CLS2 in a plan view. This undercut structure in which the side surfaces of the main conductive layer CLM are disposed inner than the side surfaces of the second sub-conductive layer CLS2 on the main conductive layer CLM may help the intermediate layer EML to be separated by the auxiliary electrodes AUE. A specific shape of the auxiliary electrodes AUE will be described in more detail below.

A via layer 150 (e.g., an organic insulating layer) may be disposed on the data conductive layer DCL. The via layer 150 may have a flat upper surface. The via layer 150 may cover the upper surface) of the interlayer insulating layer 140 on which the data conductive layer DCL is disposed, except for areas where the auxiliary electrodes AUE are disposed. In the areas where the auxiliary electrodes AUE are disposed, the via layer 150 may include openings 150_OP exposing the auxiliary electrodes AUE. The openings 150_OP of the via layer 150 may expose (e.g., completely expose) the auxiliary electrodes AUE in at least the width direction of the auxiliary electrodes AUE, e.g., in the second direction DR2.

The via layer 150 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

For example, another conductive layer may be further disposed between the bottom metal layers BML, and the data conductive layer DCL.

In case that the illustrated gate conductive layer is referred to as a first gate conductive layer, for example, a second gate conductive layer used as an electrode of a capacitor may be further disposed between the first gate conductive layer and the data conductive layer DCL. For example, in case that the display panel PNL includes heterogeneous transistors such as polysilicon transistors and oxide semiconductor transistors, a third gate conductive layer may be further disposed on or under the first gate conductive layer in addition to the first gate conductive layer used as the gate electrodes GE of the polysilicon transistors. Here, the second gate conductive layer and/or the third gate conductive layer may have substantially the same stacked structure as the first gate conductive layer. Other more gate conductive layers may be interposed.

For example, in case that the illustrated data conductive layer DCL is referred to as a first data conductive layer, another conductive layer for serving as a wiring or an electrode that the data conductive layer is responsible for herein may be disposed between the first data conductive layer and the gate conductive layer. A second data conductive layer and/or a third data conductive layer may be disposed between the first data conductive layer and the gate conductive layer. The data wirings DTL, the source electrodes SCE, the drain electrodes DNE, the first driving voltage wiring VDL, the second driving voltage wiring VSL, and the third driving voltage wiring VIL may be made of any one of the first data conductive layer, the second data conductive layer, and the third data conductive layer. However, the auxiliary electrodes AUE may be made of the first data conductive layer disposed at the highest level. Other more data conductive layers may be disposed.

The light emitting element layer DPL_M will be described.

A pixel electrode layer PXEL may be disposed on the via layer 150. The pixel electrode layer PXEL may include the pixel electrodes PXE. A single pixel electrode PXE may be disposed in each pixel PX. The pixel electrodes PXE may be connected (e.g., electrically connected) to the drain electrodes DNE, which is connected (e.g., electrically connected) to the second region 122 of the thin-film transistors TR, through contact holes (or via holes) penetrating the via layer 150. The pixel electrodes PXE may function as anodes of light emitting elements.

The pixel electrode layer PXEL may have a stacked structure in which a material layer having a high work function such as indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof are stacked. However, embodiments are not limited thereto. The material layer having a high work function may be disposed on the reflective material layer so that it is disposed close to the intermediate layer EML. The pixel electrode layer PXEL may have a multilayer structure of ITO/Mg, ITO/MgF, ITO/Ag, or ITO/Ag/ITO. However, embodiments are not limited thereto.

The pixel electrode layer PXEL may further include dummy pixel electrodes PXE_D. The dummy pixel electrodes PXE_D may be separated (e.g., electrically and physically separated) from the pixel electrodes PXE. The dummy pixel electrodes PXE_D may include first dummy pixel electrodes PXE_D1 and second dummy pixel electrodes PXE_D2. The first dummy pixel electrodes PXE_D1 and the second dummy pixel electrodes PXE_D2 may have substantially the same stacked structure as the pixel electrodes PXE.

Each of the first dummy pixel electrodes PXE_D1 may extend from the upper surface of the via layer 150 to an upper surface of the interlayer insulating layer 140 exposed by an opening 150_OP of the via layer 150 and a side surface of an auxiliary electrode AUE. The first dummy pixel electrodes PXE_D1 may be patterned to be separated and spaced apart from the pixel electrodes PXE on the upper surface of the via layer 150. The upper surface of the via layer 150 exposed as the pixel electrodes PXE may be separated from the first dummy pixel electrodes PXE_D1 may be recessed by a specific thickness compared with other areas. Although the upper surface of the via layer 150 exposed between the pixel electrodes PXE and the first dummy pixel electrodes PXE_D1 is concavely recessed, the shape of the recess is not limited thereto.

The second dummy pixel electrodes PXE_D2 may be disposed on upper surfaces of the auxiliary electrodes AUE. The second dummy pixel electrodes PXE_D2 may be adjacent to (or overlap) the first dummy pixel electrodes PXE_D1 in a plan view, but may be separated from the first dummy pixel electrodes PXE_D1 in the third direction DR3 (e.g., the thickness direction).

The first dummy pixel electrodes PXE_D1 and the second dummy pixel electrodes PXE_D2 may be disposed between the pixel electrodes PXE. The first dummy pixel electrodes PXE_D1 and the second dummy pixel electrodes PXE_D2 may be connected (e.g., electrically connected) through the auxiliary electrodes AUE. However, since the pixel electrodes PXE are electrically isolated from the first dummy pixel electrodes PXE_D1 as described above, the pixel electrodes PXE neighboring each other may operate independently without short-circuiting due to the dummy pixel electrodes PXE_D.

A pixel defining layer 160 may be disposed on the pixel electrode layer PXEL. The pixel defining layer 160 may define emission areas. The pixel defining layer 160 may include first openings 160_OP1 of the pixel defining layer 160 at least partially exposing the pixel electrodes PXE. For example, the pixel defining layer 160 may further include second openings 160_OP2 of the pixel defining layer 160 exposing the auxiliary electrodes AUE and the via layer 150 around (or adjacent to) the auxiliary electrodes AUE.

The pixel defining layer 160 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCE). The pixel defining layer 160 may include an inorganic material. For example, the pixel defining layer 160 may include a stacked layer of an inorganic layer and an organic layer.

The intermediate layer EML may be disposed in the first openings 160_OP1 of the pixel defining layer 160. The intermediate layer EML may include an organic light emitting layer. The intermediate layer EML may further include a hole injection/transport layer disposed under the organic light emitting layer and/or an electron injection/transport layer disposed on the organic light emitting layer. The planar shape of the hole injection/transport layer and/or the electron injection/transport layer may be substantially the same as the planar shape of the organic light emitting layer, and this case is assumed in the current embodiment. However, embodiments are not limited thereto, and the organic light emitting layer may be disposed only in each of the first openings 160_OP1 of the pixel defining layer 160, and the hole injection/transport layer and/or the electron injection/transport layer may extend further onto an upper surface of the pixel defining layer 160.

The intermediate layer EML may contact upper surfaces of the pixel electrodes PXE exposed in the first openings 160_OP1 of the pixel defining layer 160, may extend onto the upper surface of the pixel defining layer 160, and may extend further toward the second openings 160_OP2 of the pixel defining layer 160. The intermediate layer EML may cover not only the pixel electrodes PXE but also the first dummy pixel electrodes PXE_D1. The intermediate layer EML may be disposed on the second dummy pixel electrodes PXE_D2 disposed on the auxiliary electrodes AUE. In a plan view, the intermediate layer EML may cover the entire display area DPA of the display panel PNL. A first portion of the intermediate layer EML disposed around (or adjacent to) each auxiliary electrode AUE and a second portion of the intermediate layer EML disposed on the upper surface of each auxiliary electrode AUE may overlap (e.g., partially overlap) in a plan view. However, the second portion of the intermediate layer EML disposed on the second dummy pixel electrode PXE_D2 on each auxiliary electrode AUE may be separated (or spaced apart) from the first portion of the intermediate layer EML disposed around (or adjacent to) each auxiliary electrode AUE in the third direction DR3. Accordingly, the intermediate layers EML of neighboring pixels PX may be separated without being connected to each other. In case that the intermediate layers EML of the pixels PX are separated, unwanted light emission of an adjacent pixel PX may be prevented.

The common electrode CME may be disposed on the intermediate layer EML. The common electrode CME may include a material layer having a small work function, such as Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg). However, embodiments are not limited thereto. The common electrode CME may further include a transparent metal oxide layer disposed on the material layer having a small work function.

The common electrode CME may cover the intermediate layer EML. The common electrode CME may contact the intermediate layer EML of each first opening 160_OP1 of the pixel defining layer 160, may extend onto the upper surface of the pixel defining layer 160, and may extend further toward a second opening 160_OP2 of the pixel defining layer 160. The common electrode CME may be disposed not only on the intermediate layer EML around each auxiliary electrode AUE but also on the intermediate layer EML disposed on the second dummy pixel electrode PXE_D2 on each auxiliary electrode AUE. In a plan view, the common electrode CME may cover (or entirely cover) the display area DPA of the display panel PNL. A first portion of the common electrode CME disposed around (or adjacent to) each auxiliary electrode AUE and a second portion of the common electrode CME disposed on the upper surface of each auxiliary electrode AUE may overlap (e.g., partially overlap) each other in the third direction DR3 (or in a plan view).

The second portion of the common electrode CME disposed on each auxiliary electrode AUE may be separated from the first portion of the common electrode CME disposed around (or adjacent to) each auxiliary electrode AUE in the third direction DR3. However, since the common electrode CME around (or adjacent to) each auxiliary electrode AUE contacts (e.g., partially contacts) the side surfaces of the auxiliary electrode AUE, the whole of the common electrode CME may be connected (e.g., electrically connected) via the auxiliary electrode AUE. The auxiliary electrodes AUE made of the data conductive layer DCL may include a material having lower resistance than that of the common electrode CME. Since the auxiliary electrodes AUE including a low-resistance material are connected (e.g., electrically connected) to the common electrode CME, a voltage drop phenomenon of the common electrode CME may be reduced.

An auxiliary electrode AUE and its surrounding structures will now be described in more detail.

Figure 8:
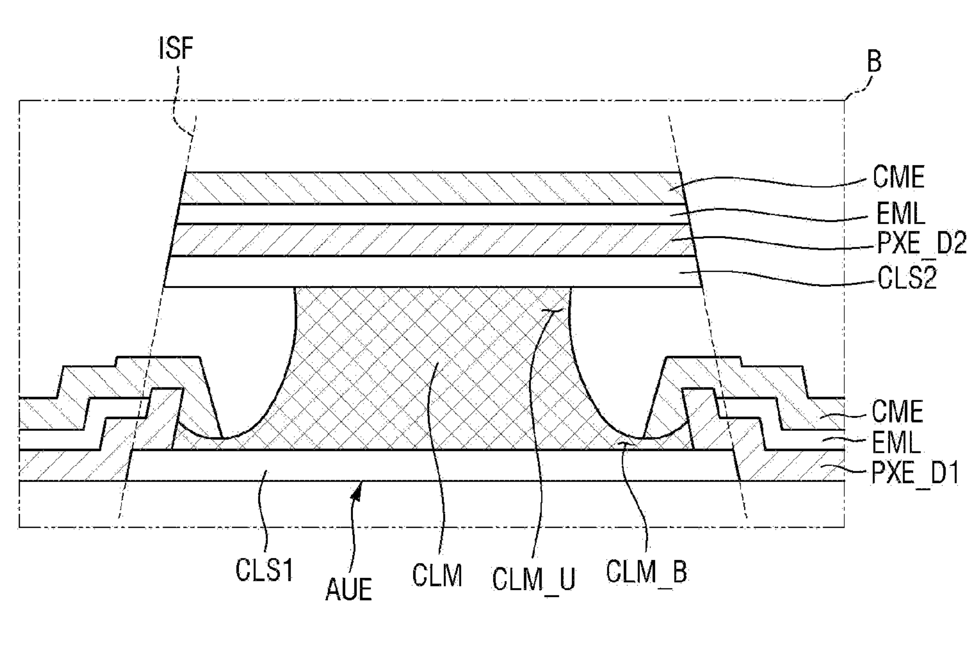
FIG. 8 is a schematic view of area B of FIG. 7.
Figure 8:
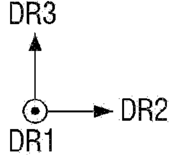
Figure 9:
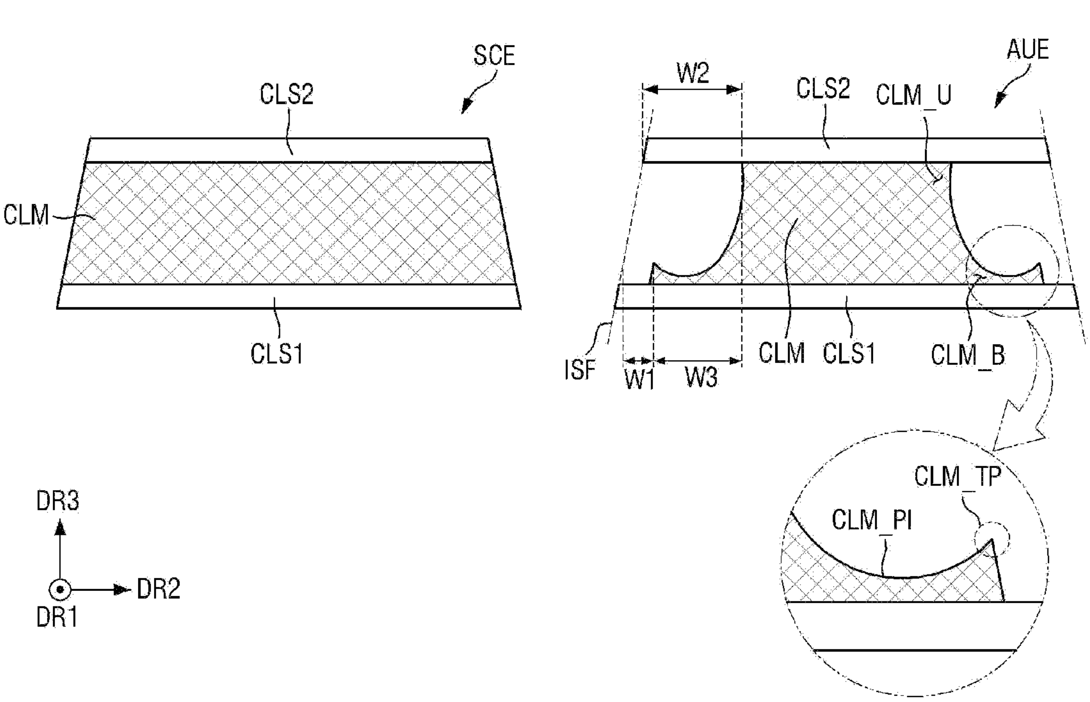
FIG. 9 is a schematic cross-sectional view schematically comparing a source electrode and an auxiliary electrode of FIG. 7.

FIG. 8 is a schematic enlarged view of area B of FIG. 7. FIG. 9 is a schematic cross-sectional view schematically comparing the source electrode SCE and the auxiliary electrode AUE of FIG. 7.

Referring to FIGS. 7, 8, and 9, the auxiliary electrode AUE may be disposed in an opening 150_OP of the via layer 150 and a second opening 160_OP2 of the pixel defining layer 150. For example, the auxiliary electrode AUE may be exposed without being covered by the via layer 150 and the pixel defining layer 160. Since the auxiliary electrode AUE extends in the first direction DR1, each of the opening 150_OP of the via layer 150 and the second opening 160_OP2 of the pixel defining layer 160 may include an area extending in the first direction DR1. This will be described in more detail with reference to FIGS. 10 and 11.

Figure 10:
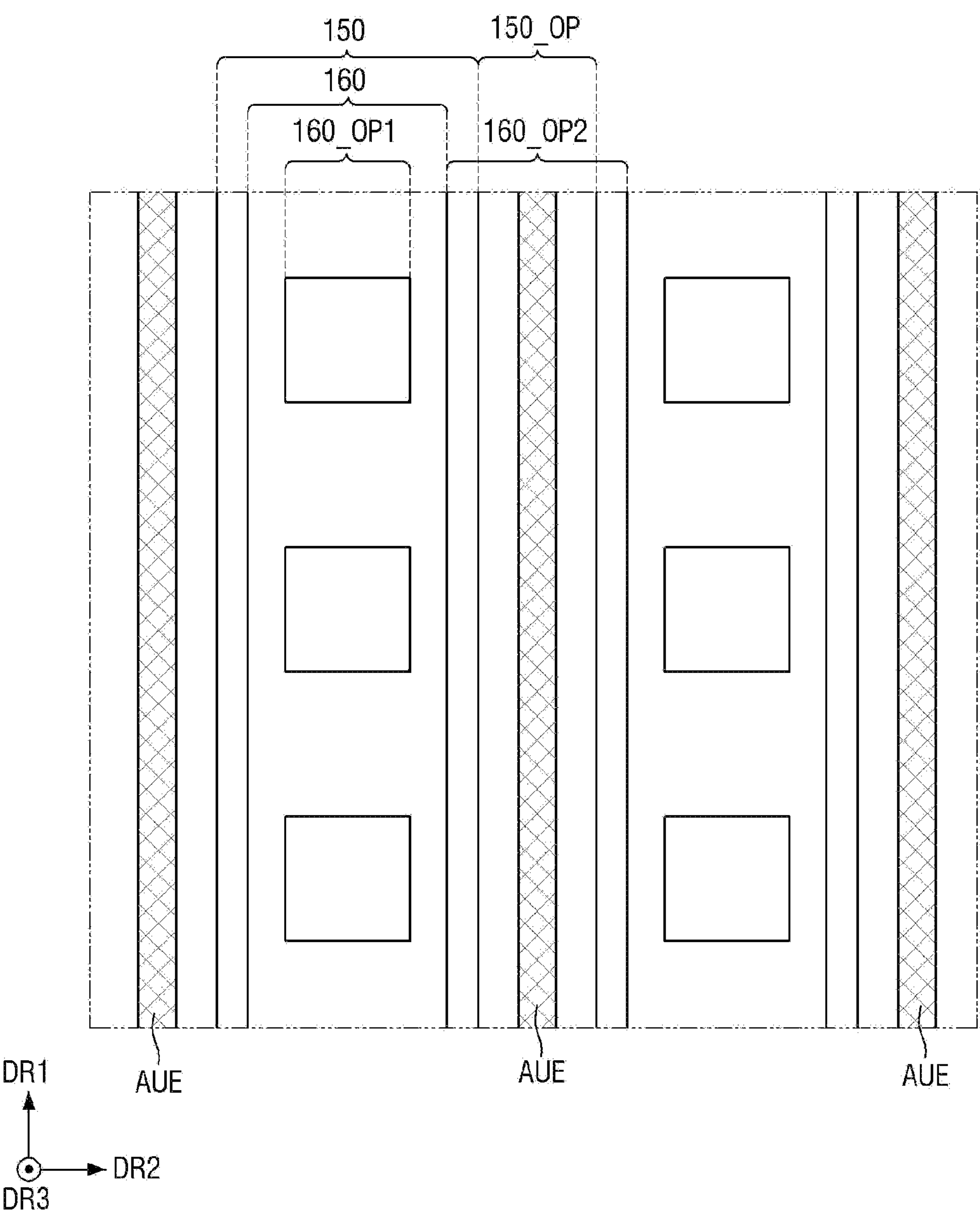
FIGS. 10 and 11 are schematic plan layout views illustrating arrangements of a pixel defining layer and a via layer according to embodiments.
Figure 11:
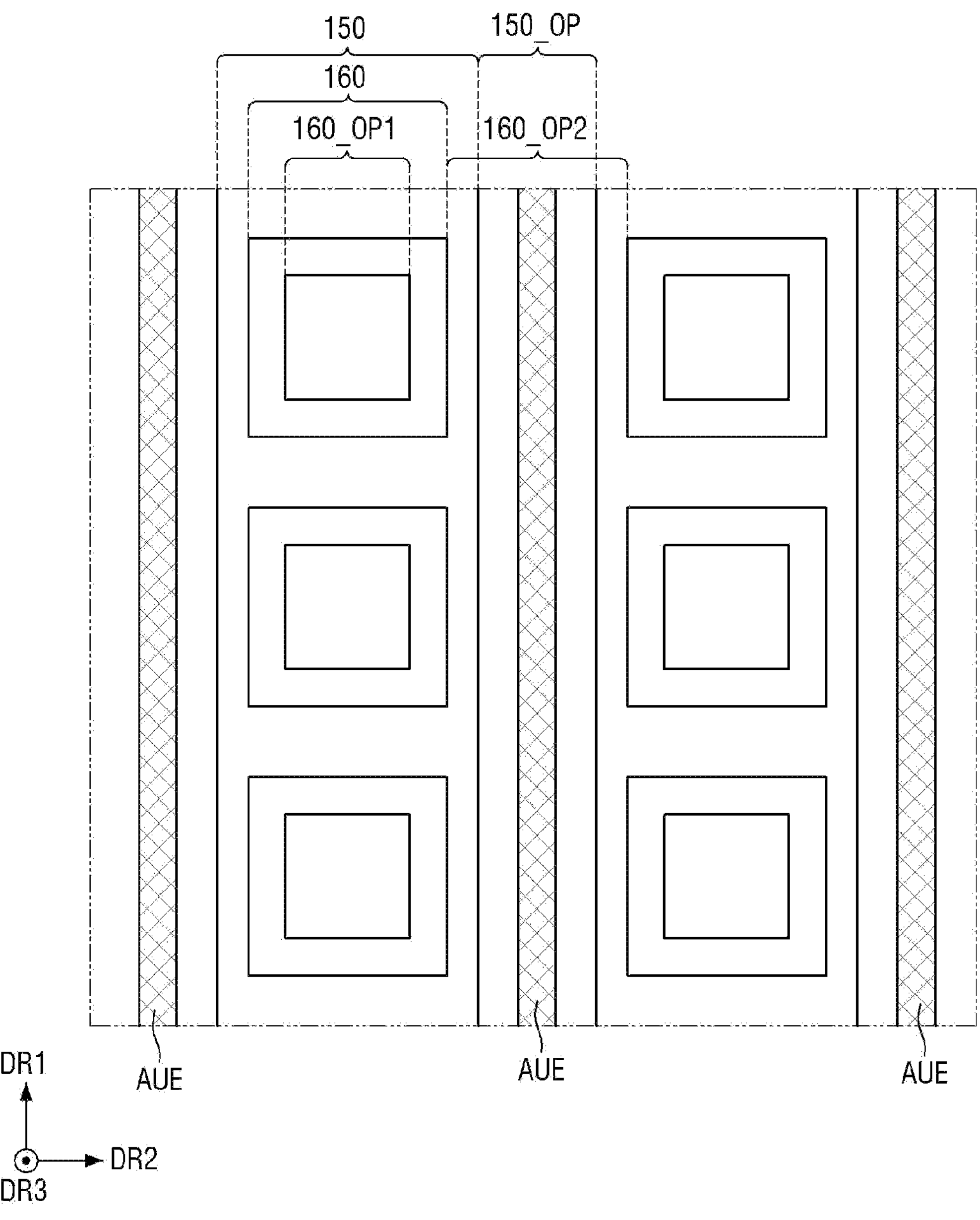

FIGS. 10 and 11 are schematic plan layout views illustrating arrangements of the pixel defining layer 160 and the via layer 150 according to embodiments.

As illustrated in FIGS. 10 and 11, the via layer 150 may have via line patterns separated from each other with an opening 150_OP of the via layer 150 interposed between them in a plan view. Each via line pattern may extend in the first direction DR1. The opening 150_OP of the via layer 150 may extend in the first direction DR1, and an auxiliary electrode AUE extending in the first direction DR1 may be disposed in the opening 150_OP of the via layer 150.

The pixel defining layer 160 may be disposed on the via layer 150. The pixel defining layer 160 may not be disposed in the opening 150_OP of the via layer 150. For example, the pixel defining layer 160 may overlap each line pattern of the via layer 150.

The second opening 160_OP2 of the pixel defining layer 160 may extend in the first direction DR1 as illustrated in FIG. 10. A width of the second opening 160_OP2 of the pixel defining layer 160 may be greater than a width of the opening 150_OP of the via layer 150.

In the embodiment of FIG. 10, pixel defining layer lines separated by the second opening 160_OP2 of the pixel defining layer 160 may extend in the first direction DR1.

The second opening 160_OP2 of the pixel defining layer 160 may further extend in the second direction DR2 as illustrated in FIG. 11. For example, pixel defining layer separation patterns separated by the second opening 160_OP2 of the pixel defining layer 160 extending in the first direction DR1 and the second direction DR2 may have an island shape.

In the embodiments of FIGS. 10 and 11, widths of the pixel defining layer lines or the pixel defining layer separation patterns in the first direction DR1 may be smaller than widths of the via line patterns in the first direction DR1.

Referring back to FIGS. 7, 8, and 9, the auxiliary electrode AUE may be substantially the same as the source electrode SCE in that it has a stacked structure of the first sub-conductive layer CLS1, the main conductive layer CLM and the second sub-conductive layer CLS2, but is different from the source electrode SCE in a side shape.

In the data conductive layer DCL (such as the source electrode SCE) covered by the via layer 150, the side surfaces of the first sub-conductive layer CLS1, the main conductive layer CLM, and the second sub-conductive layer CLS2 may be aligned with each other. In the auxiliary electrode AUE exposed through the opening 150_OP of the via layer 150, the first sub-conductive layer CLS1, the main conductive layer CLM, and the second sub-conductive layer CLS2 have substantially the same planar shape, but the width of the main conductive layer CLM in the middle in the second direction DR2 may be smaller than the widths of the first sub-conductive layer CLS1 and the second sub-conductive layer CLS2 in the second direction DR2, and both side surfaces of the main conductive layer CLM may be disposed inside both side surfaces of the first sub-conductive layer CLS1 and the second sub-conductive layer CLS2.

In the main conductive layer CLM of the auxiliary electrode AUE, a lower end portion CLM_B (e.g., a lower region adjacent to the first sub-conductive layer CLS1) may protrude compared with an upper end portion CLM_U (e.g., an upper region adjacent to the second sub-conductive layer CLS2). From imaginary side surfaces ISF connecting the side surfaces of the first sub-conductive layer CLS1 and the side surfaces of the second sub-conductive layer CLS2, the lower end portion CLM_B of the main conductive layer CLM may be recessed inward by a first width w1, and the upper end portion CLM_U of the main conductive layer CLM may be recessed inward by a second width w2.

Here, the second width w2 may be greater than the first width w1. For example, the second width w2 may be in the range of about two to four times the first width w1 or may be about three times the first width w1.

In some embodiments, the first width w1 may be in a range of about 0.05 μm to about 0.15 μm, and the second width w2 may be in a range of about 0.25 μm to about 0.35 μm. In an embodiment, the first width w1 may be about 0.1 μm, and the second width w2 may be about 0.3 μm. A maximum width w3 by which the lower end portion CLM_B protrudes from the upper end portion CLM_U may be in a range of about 0.15 μm to about 0.25 μm or may be about about 0.2 μm.

The first width w1 and second width w2 mentioned above may be measured based on each imaginary side surface ISF. However, the first width w1 and the second width w2 may have substantially the same values in case that measured based on an imaginary line extending in the third direction DR3 rather than based on each imaginary side surface ISF.

The lower end portion CLM_B of the main conductive layer CLM may include a tip portion CLM_TP on each side surface. The tip portion CLM_TP may partially protrude upward. The tip portion CLM_TP may have an acute-angled tip in cross section, but embodiments are not limited thereto.

A cross-sectional profile (or outline) of the main conductive layer CLM may become thinner from the tip portion CLM_TP of an outer surface of the lower end portion CLM_B toward the inside and then become thicker again after an inflection portion CLM_PI which is disposed at the lowest point. For example, the cross-sectional profile of the main conductive layer CLM may include a downwardly convex surface shape. The tip portion CLM_TP may have a thickness of about 1.2 to 3 times the thickness of the inflection portion CLM_PI which is a thinnest portion of the lower end portion CLM_B, but embodiments are not limited thereto.

The first dummy pixel electrodes PXE_D1 may contact the side surfaces of the first sub-conductive layer CLS1 and may extend onto the upper surface of the first sub-conductive layer CLS1 exposed by the main conductive layer CLM. A side surface of each of the first dummy pixel electrodes PXE_D1 may contact a side surface of the lower end portion CLM_B of the main conductive layer CLM. A thickness of the side surface of each of the first dummy pixel electrodes PXE_D1 may be greater than or equal to a thickness of the side surface of the lower end portion CLM_B of the main conductive layer CLM in contact with the side surface of the first dummy pixel electrode PXE_D1, e.g., the thickness of the tip portion CLM_TP. Therefore, an upper end portion of the side surface of each of the first dummy pixel electrodes PXE_D1 may include a region exposed without being covered by the main conductive layer CLM. However, each of the first dummy pixel electrodes PXE_D1 may not extend beyond the tip portion CLM_TP of the lower end portion CLM_B of the main conductive layer CLM to inside the tip portion CLM_TP.

In an embodiment, the side surfaces of the lower end portion CLM_B of the main conductive layer CLM may have the inclination at an acute angle, whereas the side surfaces of the first dummy pixel electrodes PXE_D1 in contact with the side surfaces of the lower end portion CLM_B of the main conductive layer CLM have the inclination at an obtuse angle complementary to the acute angle. For example, the upper end portions of the side surfaces of the first dummy pixel electrodes PXE_D1 which are not covered by the side surfaces of the lower end portion CLM_B of the main conductive layer CLM may have the inclination at an obtuse angle. A method of forming this side shape of the first dummy pixel electrodes PXE_D1 may be understood through a method of fabricating a display device which will be described below.

A second dummy pixel electrode PXE_D2 may be disposed on the second sub-conductive layer CLS2 and may have substantially the same planar shape as the second sub-conductive layer CLS2. For example, the second dummy pixel electrode PXE_D2 may be disposed only on an upper surface of the second sub-conductive layer CLS2 and not on the side surfaces of the second sub-conductive layer CLS2. In some cases, however, the second dummy pixel electrode PXE_D2 may be disposed on the side surfaces of the second sub-conductive layer CLS2.

The intermediate layer EML may be disposed on the second dummy pixel electrode PXE_D2 disposed on the auxiliary electrode AUE and the first dummy pixel electrodes PXE_D1 disposed around (or adjacent to) the auxiliary electrode AUE. The intermediate layer EML on the second dummy pixel electrode PXE_D2 may have substantially the same planar shape as the second dummy pixel electrode PXE_D2. The intermediate layer EML on the second dummy pixel electrode PXE_D2 may be separated from the intermediate layer EML disposed on the first dummy pixel electrodes PXE_D1 around (or adjacent to) the auxiliary electrode AUE in the third direction DR3.

The intermediate layer EML may cover the first dummy pixel electrodes PXE_D1 around (or adjacent to) the auxiliary electrode AUE but may partially expose a side surface of each first dummy pixel electrode PXE_D1 or a region (hereinafter, referred to as a side portion) near the side surface of each first dummy pixel electrode PXE_D1 in contact with the auxiliary electrode AUE.

The common electrode CME may be disposed on a portion of the side portion of each of the first dummy pixel electrodes PXE_D1 which is not covered by the intermediate layer EML. The common electrode CME may be connected (e.g., electrically connected) to each of the first dummy pixel electrodes PXE_D1 through a portion in contact with the side portion of the first dummy pixel electrode PXE_D1 and may be connected (e.g., electrically connected) to the auxiliary electrode AUE through each of the first dummy pixel electrodes PXE_D1 in contact with the auxiliary electrode AUE. Furthermore, at least a portion of the common electrode CME may extend beyond each tip portion CLM_TP of the lower end portion CLM_B of the main conductive layer CLM to inside the tip portion CLM_TP. In this extension portion, the common electrode CME may contact (e.g., directly contact) the main conductive layer CLM. In case that the common electrode CME contacts (e.g., directly contacts) the main conductive layer CLM, contact resistance may be lowered. Accordingly, the voltage drop phenomenon of the common electrode CME may be further reduced.

The common electrode CME may be disposed on an upper surface of the intermediate layer EML disposed on the auxiliary electrode AUE. Although the common electrode CME on the auxiliary electrode AUE is disposed only on the upper surface of the intermediate layer EML in the drawings, the common electrode CME may be disposed on side surfaces of the intermediate layer EML, side surfaces of the second dummy pixel electrode PXE_D2, and/or the side surfaces of the second sub-conductive layer CLS2 thereunder.

As described above, the display device 1 according to an embodiment may include the auxiliary electrodes AUE. For example, the auxiliary electrodes AUE and the source electrodes SCE or the drain electrodes DNE may be disposed on the same layer and made of the same conductive layer. For example, the display device 1 reduces the voltage drop phenomenon of the common electrode CME by implementing an electrical connection between common electrode CME and the auxiliary electrodes AUE. Furthermore, the display device 1 may separate the intermediate layer EML through the undercut shape of the auxiliary electrodes AUE, thereby disconnecting the intermediate layers EML of adjacent pixels PX from each other.

A method of fabricating the display device described above will now be described.

FIGS. 12 through 21 are schematic cross-sectional views illustrating steps of a method of fabricating a display device according to an embodiment. In FIGS. 12 through 21, layers disposed between a first substrate SUB1 and a data conductive layer DCL are not illustrated for descriptive convenience.

Figure 12:
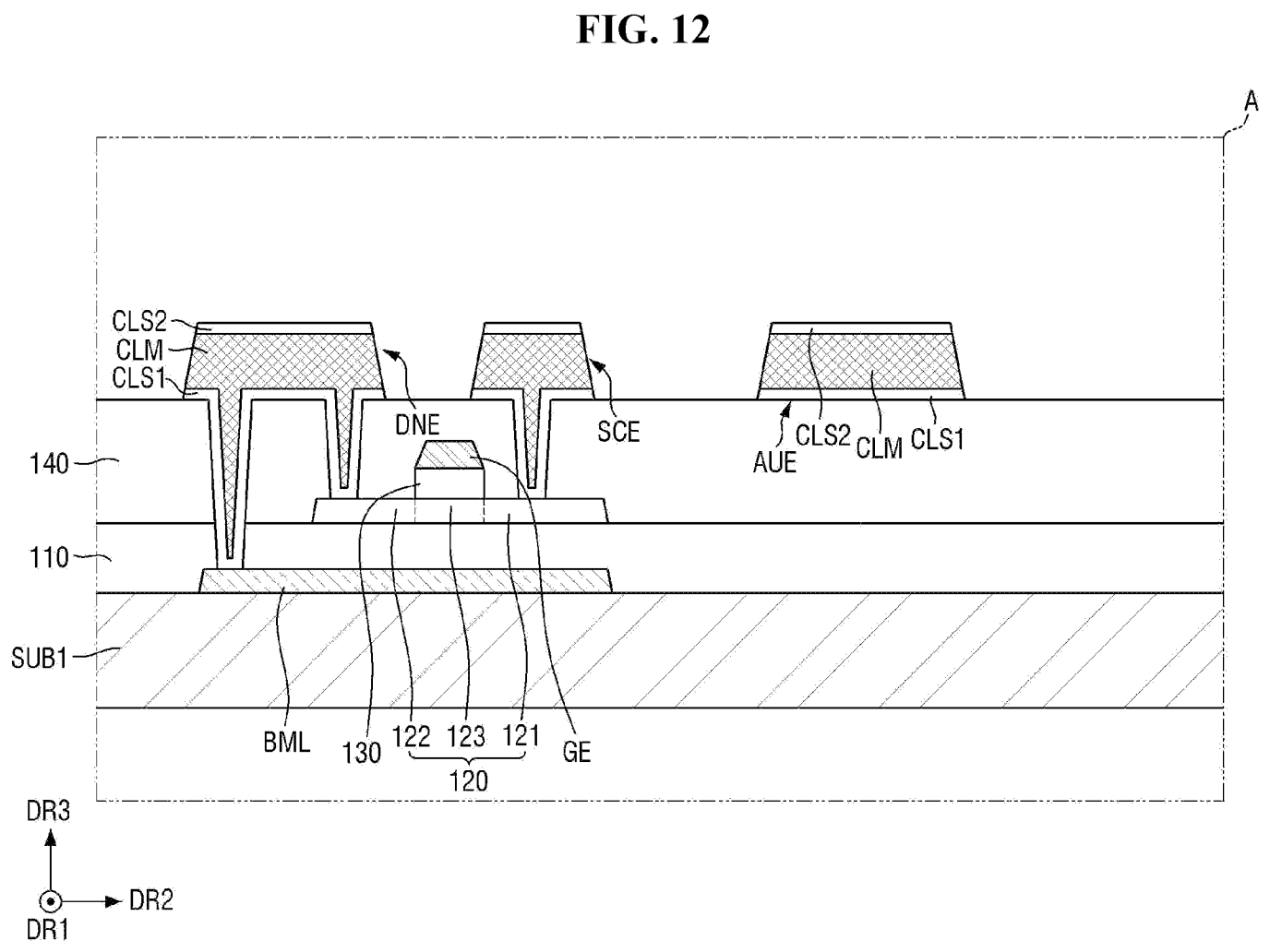

Referring to FIGS. 12 and 7, a substrate on which the data conductive layer DCL including a source electrode SCE, a drain electrode DNE, and an auxiliary electrode AUE is formed on an interlayer insulating layer 140 is prepared. A method of forming this structure is as follows. A bottom metal layer BML may be formed on the substrate, and a buffer layer 110 may be formed on the bottom metal layer BML. Then, a semiconductor layer 120 may be formed on the buffer layer 110, and a gate insulating layer 130 and a gate conductive layer may be formed on the semiconductor layer 120. For example, the gate conductive layer may be patterned to form a gate electrode GE, and the gate insulating layer 130 may be patterned by using the gate electrode GE as an etch mask. For example, the interlayer insulating layer 140 may be stacked, and contact holes respectively exposing the bottom metal layer BML, a first region 121 of the semiconductor layer 120, and a second region 122 of the semiconductor layer 120 may be formed in the interlayer insulating layer 140. For example, a first sub-conductive layer CLS1 including titanium, a main conductive layer CLM including aluminum, and a second sub-conductive layer CLS2 including titanium may be sequentially stacked and then patterned to form the source electrode SCE, the drain electrode DNE, and the auxiliary electrode AUE as illustrated in FIG. 12. Side surfaces of the source electrode SCE, the drain electrode DNE, and the auxiliary electrode AUE may have the inclination at an acute angle, but embodiments are not limited thereto.

Figure 13:
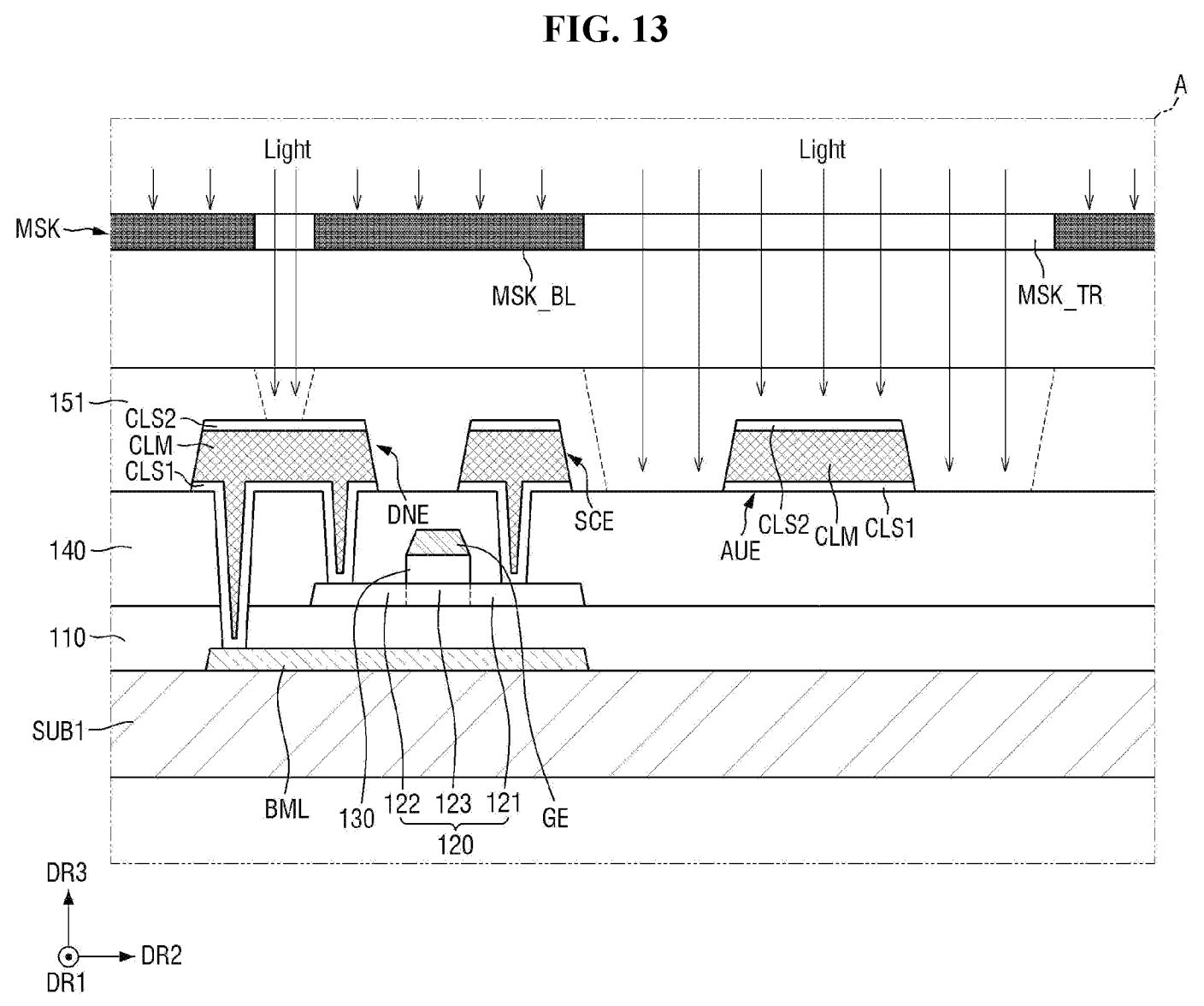

Referring to FIGS. 13 and 7, an organic material layer 151 may be stacked by applying an organic material for a via layer 150 on the data conductive layer DCL. The organic material may include a positive photosensitive material. The organic material layer 151 may be dried and baked and then exposed to light using a photomask MSK. The photomask MSK may include light transmitting areas MSK_TR and light blocking areas MSK_BL. The light transmitting areas MSK_TR may be disposed to correspond to contact hole forming areas exposing an opening 150_OP of the via layer 150 and the drain electrode DNE.

Figure 14:
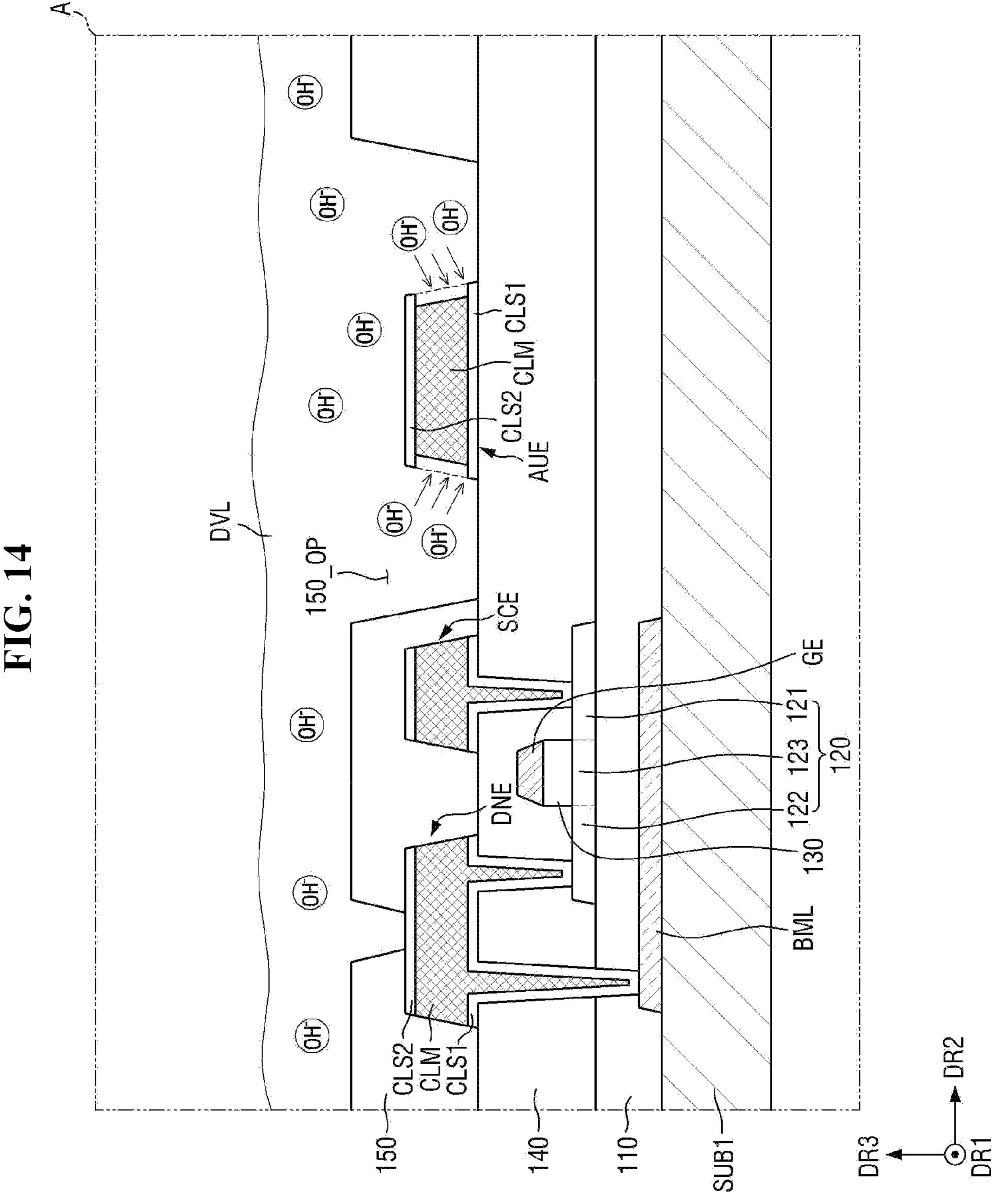

Referring to FIGS. 14 and 7, a developer process may be performed by applying a developer DVL. The developer DVL may include a tetramethylammonium hydroxide (TMAH) solution. The concentration of TMAH in the developer DVL may be in the range of about 0.04% to about 5%. However, embodiments are not limited thereto. An exposed portion of the organic material layer 151 may be selectively removed by the developer DVL.

The developer process time may include not only a first process time for removing (e.g., completely removing) the exposed portion of the organic material layer 151 but also a second process time for inducing a primary undercut of the auxiliary electrode AUE. For example, in case that the time required to remove (e.g., completely remove) the exposed portion using the developer DVL is about 60 seconds, the developer process may be performed for a time of more than 60 seconds.

In case that the first process time elapses, the exposed portion of the organic material layer 151 may be removed to form a via layer 150, and upper and side surfaces of the auxiliary electrode AUE may be exposed to the developer DVL. The developer DVL including the TMAH solution may include hydroxide ions (OH—). Hydroxide ions may have a property of etching a metal material. In the auxiliary electrode AUE, in case that an etch rate of the main conductive layer CLM for hydroxide ions is greater than etch rates of the first sub-conductive layer CLS1 and the second sub-conductive layer CLS2, the main conductive layer CLM may be mainly (or selectively) etched (as primary etching). As a result, the auxiliary electrode AUE may have an undercut shape in which side surfaces of the main conductive layer CLM are disposed inner than (or recessed inward from) side surfaces of the second sub-conductive layer CLS2 on the main conductive layer CLM. Since aluminum has a much greater etch rate for hydroxide ions than titanium, in case that the main conductive layer CLM includes aluminum and the first sub-conductive layer CLS1 and the second sub-conductive layer CLS2 include titanium as described above, the main conductive layer CLM may be selectively etched.

In order to separate an intermediate layer EML through the undercut shape of the auxiliary electrode AUE, a width of the undercut of the auxiliary electrode AUE may be about 0.3 μm or more. For example, the width of the undercut of the auxiliary electrode AUE may be a width by which the side surfaces of the main conductive layer CLM are disposed inner than (or recessed inward from) the side surfaces of the second sub-conductive layer CLS2 or a width by which the side surfaces of the second sub-conductive layer CLS2 protrude from the side surfaces of the main conductive layer CLM. In case that the width has a value of about 0.4 μm, stable separation of the intermediate layer EML may be guaranteed. However, in the developer process, not only the auxiliary electrode AUE but also the via layer 150 may be exposed to the developer DVL. For example, the via layer 150 made of the unexposed organic material layer 151 may be damaged in case that exposed to the developer DVL for a long time. In case that the second process time is limited to such an extent that the width of the undercut of the auxiliary electrode AUE has a range of about 0.05 μm to about 0.15 μm (e.g., a value of about 0.1 μm), significant damage to the via layer 150 by the developer DVL may be minimized. The second process time may be shorter than the first process time, for example, may be ¼ to ½ of the first process time. For example, in case that the first process time is about 60 seconds, the second process time following the first process time may be in the range of about 15 seconds to about 30 seconds.

As confirmed experimentally, in case that the auxiliary electrode AUE is exposed to a developer DVL having a TMAH concentration of about 2.38% for about 20 seconds, an undercut of about 0.1 μm is formed in the auxiliary electrode AUE. For example, the developer process performed for about 80 seconds may remove the exposed portion of the organic material layer 151 to form patterns of the via layer 150 while forming an undercut of about 0.1 μm to the auxiliary electrode AUE. Here, the width of the undercut of the auxiliary electrode AUE may be measured as a distance from each side surface of the second sub-conductive layer CLS2 to a side surface of an upper end portion CLM_U of the main conductive layer CLM adjacent to the second sub-conductive layer CLS2. However, side surfaces of a lower end portion CLM_B of the main conductive layer CLM adjacent to the first sub-conductive layer CLS1 may be recessed inward from the side surfaces of the first sub-conductive layer CLS1, or the side surfaces of the first sub-conductive layer CLS1 may protrude outward from the side surfaces of the lower end portion CLM_B of the main conductive layer CLM). Thus, a width of this recess may have a similar value to the width of the undercut of the auxiliary electrode AUE.

Figure 15:
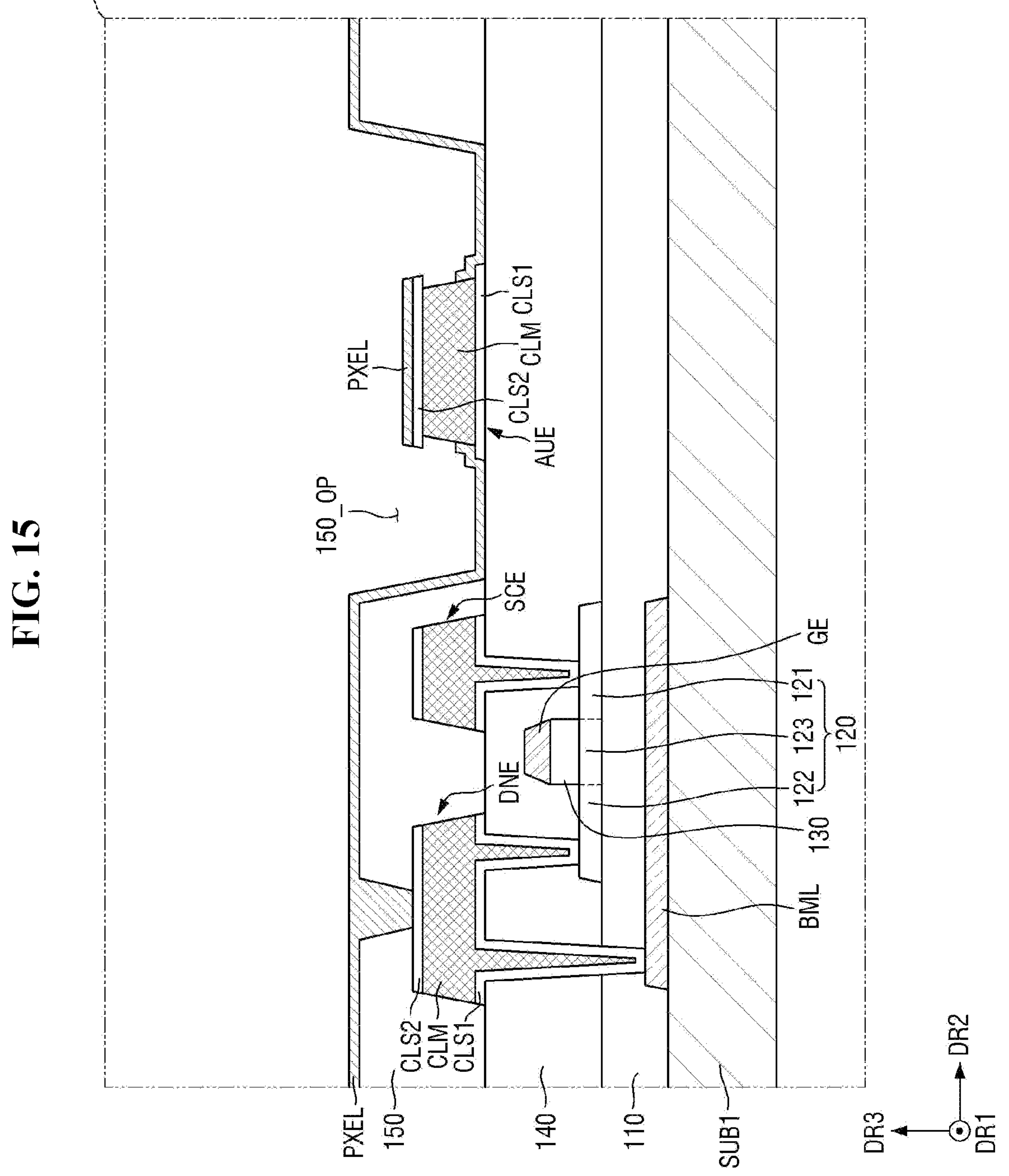

Referring to FIGS. 15 and 7, a pixel electrode layer PXEL may be stacked. The pixel electrode layer PXEL may be formed by a sputtering process or a chemical vapor deposition process. The pixel electrode layer PXEL may be deposited to cover or (entirely cover) the surface of the structure on the first substrate SUB1. However, since the auxiliary electrode AUE has an undercut structure, the auxiliary electrode AUE may have poor step coverage. Therefore, the pixel electrode layer PXEL deposited on the upper surface of the auxiliary electrode AUE and the pixel electrode layer PXEL deposited around (or adjacent to) the auxiliary electrode AUE may be spaced apart and separated from each other in the third direction DR3.

The pixel electrode layer PXEL on the side of the auxiliary electrode AUE may be deposited on the first sub-conductive layer CLS1 relatively protruding from the main conductive layer CLM and may further contact the side surfaces of the main conductive layer CLM. In case that the first sub-conductive layer CLS1 protrudes further outward than the second sub-conductive layer CLS2 and a portion of the lower end portion CLM_B of the main conductive layer CLM is exposed in the third direction DR3 without being covered by the second sub-conductive layer CLS2, the pixel electrode layer PXEL may be deposited to extend to the side surfaces of the main conductive layer CLM. In case that the side surfaces of the lower end portion CLM_B of the main conductive layer CLM are covered by the second sub-conductive layer CLS2 in the third direction DR3, a deposition material proceeding in a horizontal or oblique direction during a deposition process may be deposited on the side surfaces of the lower end portion CLM_B of the main conductive layer CLM. In case that an inclined deposition method or a rotation deposition method is used, a larger amount of deposition material may be deposited on protruding portions of the first sub-conductive layer CLS1 and the side surfaces of the main conductive layer CLM.

In case that the pixel electrode layer PXEL is deposited on the side surfaces of the main conductive layer CLM, the pixel electrode layer PXEL disposed on the side surfaces of the main conductive layer CLM may be separated from the pixel electrode layer PXEL deposited on an upper surface of the second sub-conductive layer CLS2. However, the pixel electrode layer PXEL around (or adjacent to) the auxiliary electrode AUE and the pixel electrode layer PXEL on the upper surface of the auxiliary electrode AUE may be connected (e.g., electrically connected) through the auxiliary electrode AUE.

Figure 16:
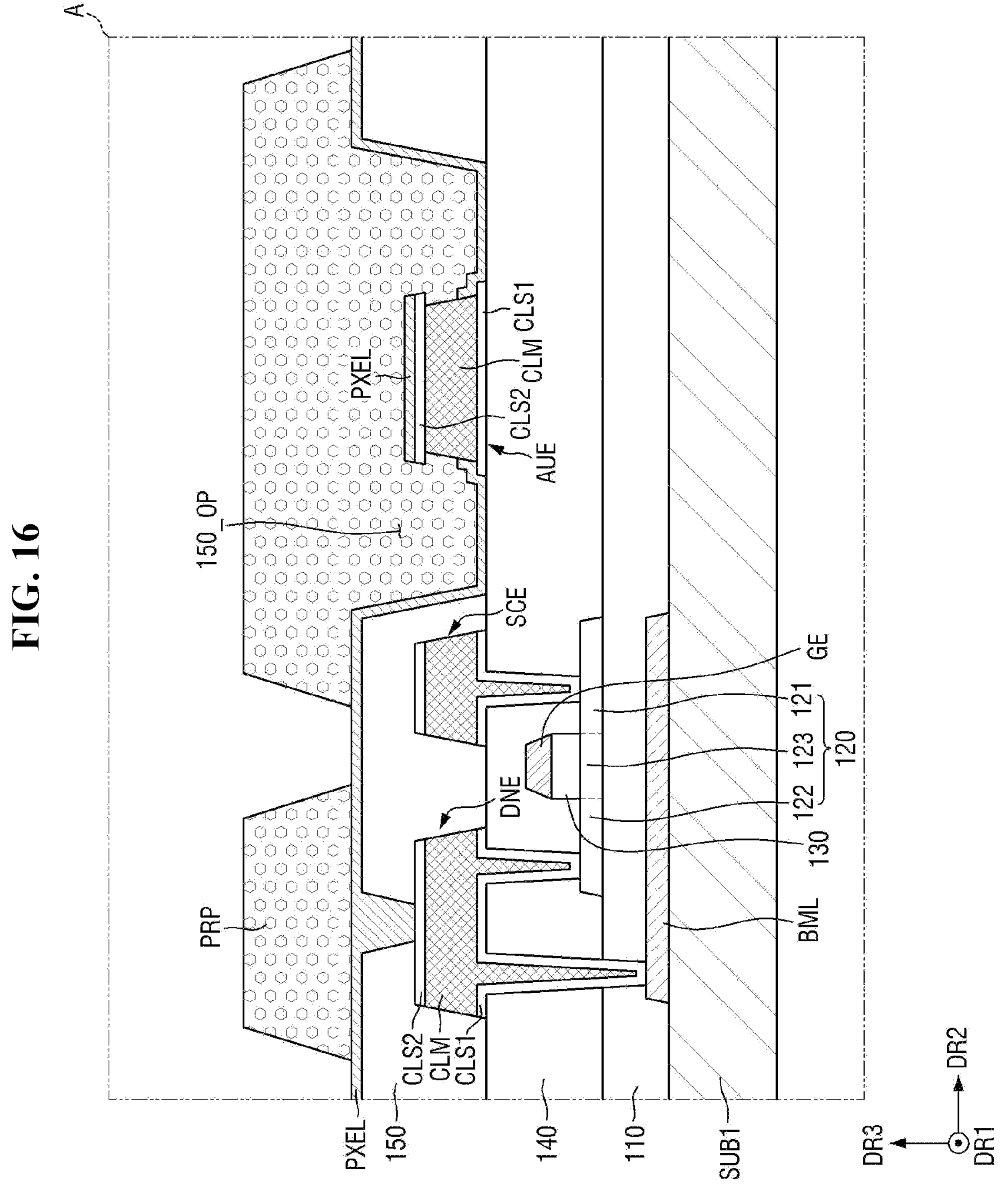

Referring to FIGS. 16 and 7, a photoresist pattern PRP may be formed on the pixel electrode layer PXEL. For example, a photoresist layer may be applied and then exposed and developed to form the photoresist pattern PRP exposing an area to be removed from the pixel electrode layer PXEL. As described above, since the pixel electrode layer PXEL is separated into a pixel electrode PXE and a first dummy pixel electrode PXE_D1 on the via layer 150, the photoresist pattern PRP may be formed to expose the area to be removed from the pixel electrode layer PXEL. For example, the opening area of the photoresist pattern PRP may be appropriately adjusted according to the shape of the pixel electrode PXE or the dummy pixel electrode PXE_D.

Figure 17:
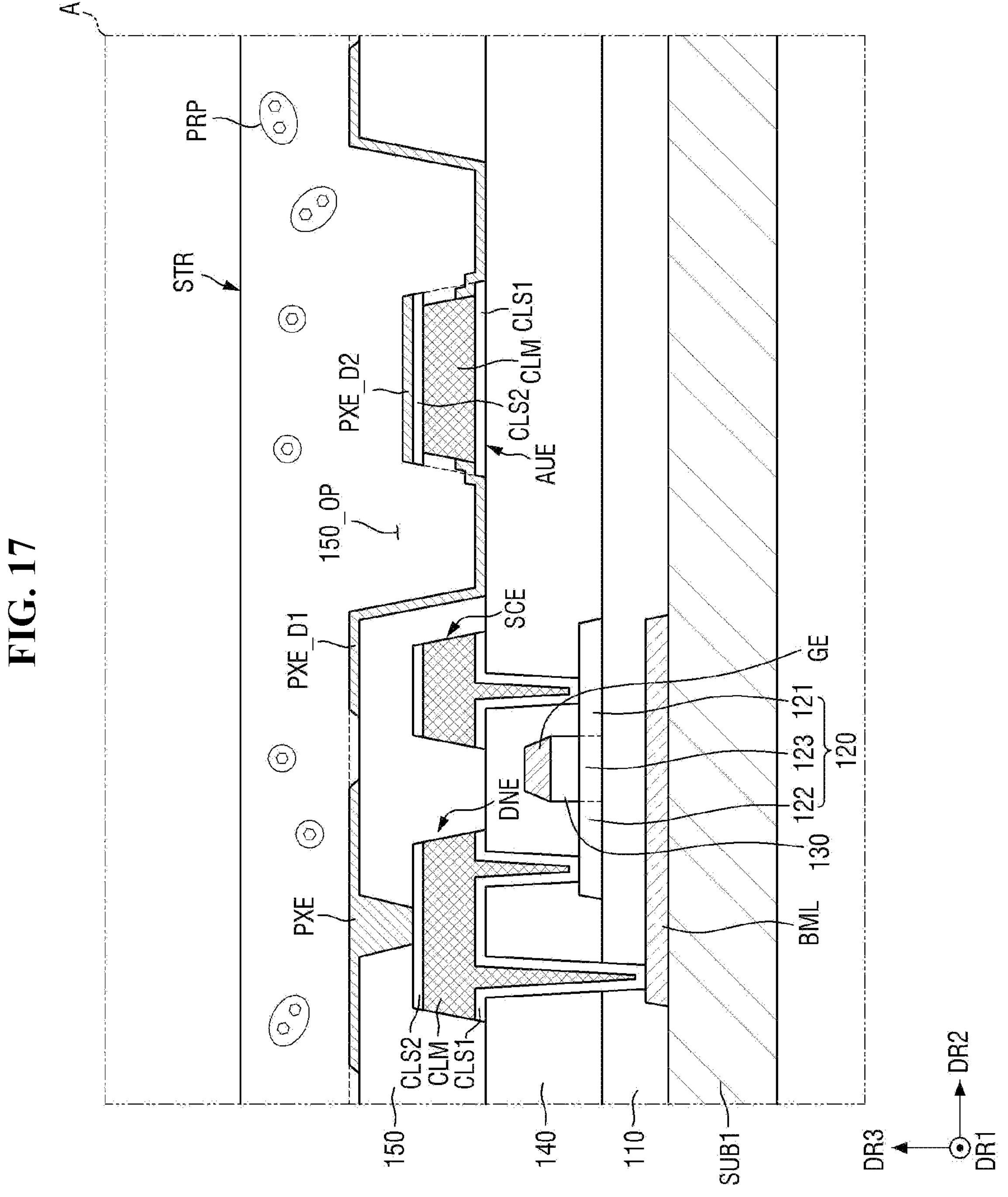

Referring to FIGS. 17 and 7, the pixel electrode layer PXEL may be etched by using the photoresist pattern PRP as an etch mask. As a result, the first dummy pixel electrode PXE_D1 may be separated from the pixel electrode PXE. Then, the photoresist pattern PRP may be removed using a stripper STR. The stripper STR may include an amine group. During the stripping process, the photoresist pattern PRP may be removed.

Figure 18:
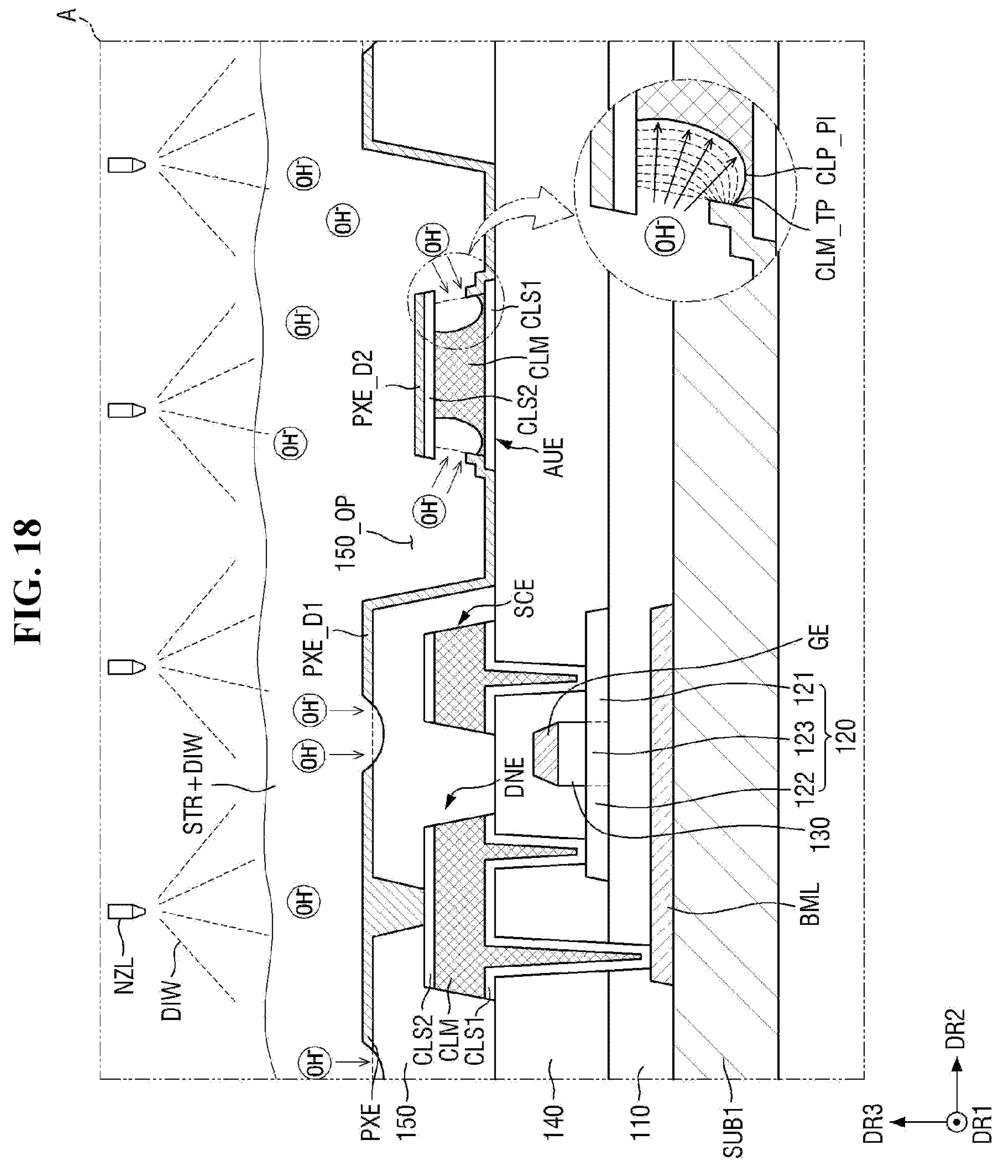

Referring to FIGS. 18 and 7, a cleaning process may be performed. The cleaning process may be performed using cleaning water. The cleaning water may be deionized water (DIW). For example, the deionized water (DIW) may be sprayed toward the resultant structure of FIG. 17 through cleaning nozzles NZL or the like. The sprayed deionized water (DIW) may react with the amine group of the residual stripper STR to generate hydroxide ions (OH—). As described above, hydroxide ions may have a property of etching a metal material. In case that an etch rate of the main conductive layer CLM for hydroxide ions is greater than etch rates of the first sub-conductive layer CLS1, the second sub-conductive layer CLS2 and the pixel electrode layer PXEL (e.g., PXE, PXE_D1 and PXE_D2), the main conductive layer CLM may be mainly (or selectively) etched.

During the cleaning process, most areas may be covered by the pixel electrode layer PXEL (e.g., PXE, PXE_D1 and PXE_D2). The pixel electrode layer PXEL (e.g., PXE, PXE_D1 and PXE_D2) may not be significantly etched during the cleaning process due to its low etch rate for hydroxide ions. For example, although the second sub-conductive layer CLS2 is exposed to hydroxide ions, the second sub-conductive layer CLS2 may not be significantly etched during the cleaning process due to its low etch rate.

During the cleaning process, the side surfaces of the main conductive layer CLM may be etched (as secondary etching) by reacting with hydroxide ions. In case that the main conductive layer CLM is etched, the first dummy pixel electrode PXE_D1 substantially functions as an etch mask. Therefore, the main conductive layer CLM exposed without being covered by the first dummy pixel electrode PXE_D1 may be etched.

Since hydroxide ions are included in the deionized water (DIW), the etching at this time may be isotropic etching. Therefore, as the etching proceeds, a portion of the main conductive layer CLM which is in contact with the first dummy pixel electrode PXE_D1 may be etched. However, the main conductive layer CLM may be etched more actively inside the portion that is in contact (e.g., complete contact) with the first dummy pixel electrode PXE_D1 than at the portion. As a result, an outer surface of the lower end portion CLM_B of the main conductive layer CLM may have a tip portion CLM_TP, and an inflection portion CLM_PI, which is disposed at the lowest point, may be disposed inside the outer surface. As the main conductive layer CLM is etched through the cleaning process, a secondary undercut in which the side surfaces of the main conductive layer CLM are further recessed may be induced. A final undercut width of the main conductive layer CLM after the secondary etching may be about 0.3 μm or more and, in an embodiment, may have a value of about 0.4 μm.

The etch rate by the cleaning process may be affected by the deionized water (DIW) content. In case that the content of the deionized water (DIW) in a solution of the residual stripper STR and the provided the deionized water (DIW) is too small, the etching efficiency may not be high, because a hydroxide ion production rate is low. For example, in case that the deionized water (DIW) content is too large, the main conductive layer CLM may not be actively etched, because hydroxide ions are diluted, and a pH holding time is short. In case that the deionized water (DIW) content is in the range of 90 to 99%, efficient etching may be performed, because the pH holding time is increased. As confirmed experimentally, in case that the deionized water (DIW) is provided at a flow rate of about 140 liters to about 290 liters per minute (LPM) per unit area ($m^2$), the deionized water (DIW) content may be maintained in the range of about 90% to about 99%. The cleaning time may be maintained longer than the second process time of the developer process described above. The total cleaning time may be in the range of about 100 seconds to about 300 seconds or less. However, embodiments are not limited thereto. In case that the cleaning time is too long, the main conductive layer CLM may be over-etched. Therefore, the cleaning time may be within the range of about 300 seconds or less.

An upper surface of the via layer 150 in a portion where the pixel electrode PXE is separated from the first dummy pixel electrode PXE_D1 may be exposed to hydroxide ions during the cleaning process. Since the cleaning process is performed for a relatively long time unlike the developer process, hydroxide ions generated during the cleaning process may react with the exposed via layer 150 to etch a portion of the via layer 150. As a result, in the portion where the pixel electrode PXE is separated from the first dummy pixel electrode PXE_D1, the upper surface of the via layer 150 may be recessed by a specific thickness compared with other areas. Although a portion of the upper surface of the via layer 150 is recessed through the cleaning process as described above, since this portion is not a portion that performs an active function in terms of light emission or pixel circuit configuration, the recessed portion of the upper surface of the via layer 150 may not significantly affect display quality.

Referring to FIGS. 19 and 7, a pixel defining layer 160 including a first opening 160_OP1 of the pixel defining layer 160 and a second opening 160_OP2 of the pixel defining layer 160 may be formed. The pixel defining layer 160 may be formed by etching by using a separate photoresist pattern, or the pixel defining layer 160 may include a photosensitive material and thus may be formed through exposure and development.

Figure 20:
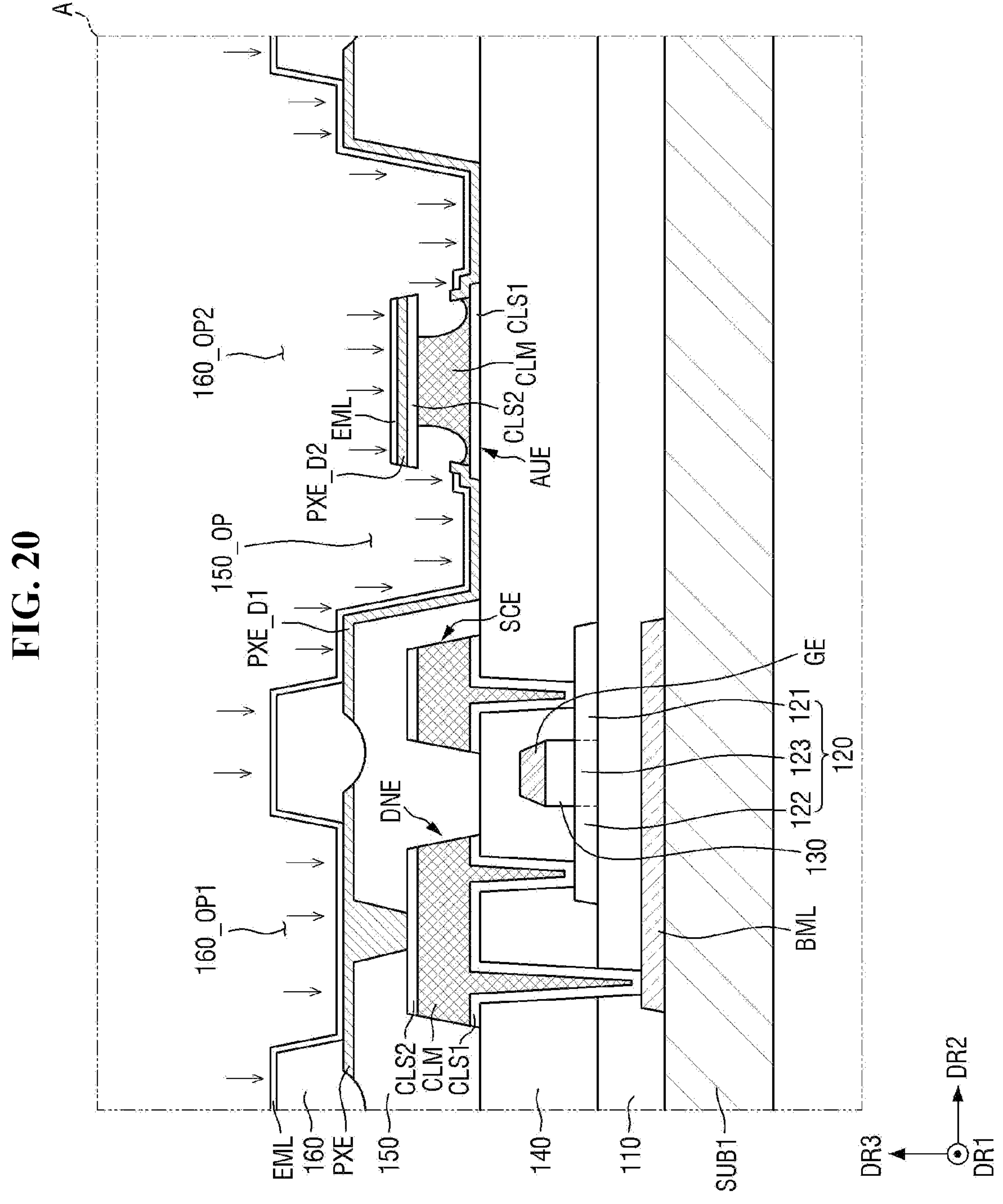

Referring to FIGS. 20 and 7, the intermediate layer EML may be stacked. The intermediate layer EML may be deposited by using a method such as evaporation. The intermediate layer EML may be deposited in the entire display area DPA without a substantial mask. Although the intermediate layer EML is deposited over the entire surface, since the auxiliary electrode AUE has an undercut structure having poor step coverage, the intermediate layer EML may be separated by the auxiliary electrode AUE.

For example, the intermediate layer EML may be deposited not only on the pixel electrode PXE exposed by the first opening 160_OP1 of the pixel defining layer 160 but also on the first dummy pixel electrode PXE_D1 disposed around (or adjacent to) the auxiliary electrode AUE. For example, the intermediate layer EML may be deposited on a second dummy pixel electrode PXE_D2 on the upper surface of the auxiliary electrode AUE. However, the intermediate layer EML disposed on the auxiliary electrode AUE may be spaced apart and separated from the intermediate layer EML disposed around (or adjacent to) the auxiliary electrode AUE in the third direction DR3. Accordingly, the discontinuous structure of the intermediate layer EML may be completed.

The intermediate layer EML may be formed under a vertical deposition condition in which a deposition material has greater straightness than the pixel electrode layer PXEL or a common electrode CME. The intermediate layer EML around (or adjacent to) the auxiliary electrode AUE may be disposed farther from the auxiliary electrode AUE than the first dummy pixel electrode PXE_D1. The intermediate layer EML may partially expose an end of the first dummy pixel electrode PXE_D1 on the side of the auxiliary electrode AUE. For example, at least a portion of the first dummy pixel electrode PXE_D1 which is disposed on the first sub-conductive layer CLS1 may be exposed without being covered by the intermediate layer EML, and the first dummy pixel electrode PXE_D1 may be connected (e.g., electrically connected) to the common electrode CME in this portion.

Figure 21:
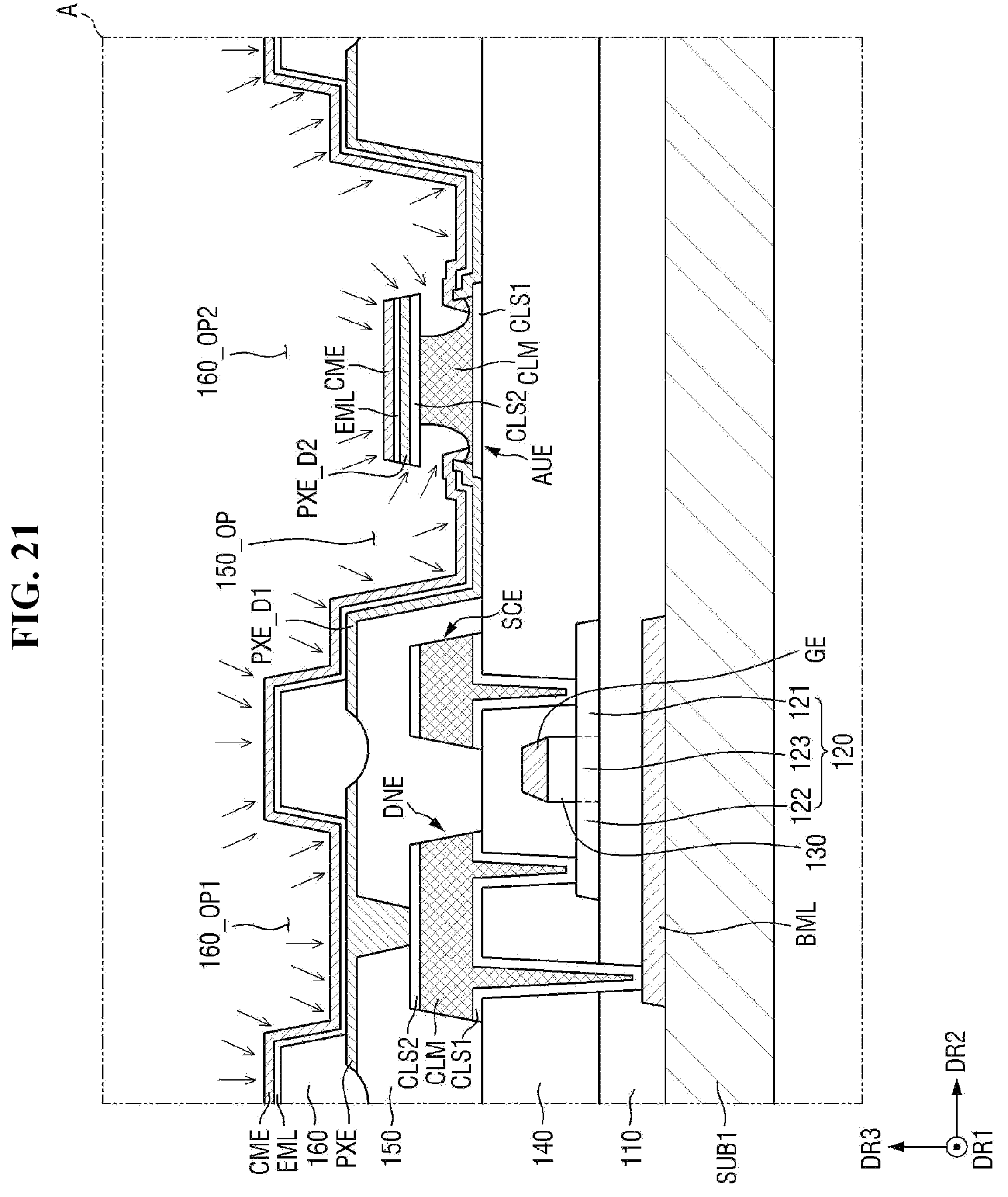

Referring to FIGS. 21 and 7, the common electrode CME may be stacked. The common electrode CME may be formed by a sputtering process or a chemical vapor deposition process. The common electrode CME may be deposited to cover (e.g., entirely cover) the entire surface of the structure on the first substrate SUB1. For example, the common electrode CME may be stacked to cover the whole of the intermediate layer EML. Since the auxiliary electrode AUE has poor step coverage due to its undercut structure, the common electrode CME deposited on the upper surface of the auxiliary electrode AUE may be spaced apart and separated from the common electrode CME deposited around (or adjacent to) the auxiliary electrode AUE in the third direction DR3.

The common electrode CME may be deposited by using a method in which vertical deposition of a deposition material is smaller than that of the intermediate layer EML. Therefore, the common electrode CME may be deposited on a portion of a side portion of the first dummy pixel electrode PXE_D1 which is exposed without being covered by the intermediate layer EML on the side of the auxiliary electrode AUE. As a result, the common electrode CME may be connected (e.g., electrically connected) to the first dummy pixel electrode PXE_D1 through a portion in contact with the side portion of the first dummy pixel electrode PXE_D1 and may be connected (e.g., electrically connected) to the auxiliary electrode AUE through the first dummy pixel electrode PXE_D1 in contact with the auxiliary electrode AUE. For example, the common electrode CME may extend beyond the tip portion CLM_TP of the lower end portion CLM_B of the main conductive layer CLM to inside the tip portion CLM_TP. In case that an inclined deposition method or a rotation deposition method is used, the area of a portion of the common electrode CME which directly contacts a side surface of the main conductive layer CLM may further increase. In case that the common electrode CME directly contacts the main conductive layer CLM, contact resistance may be lowered. Accordingly, a voltage drop phenomenon of the common electrode CME may be further reduced. For example, the common electrode CME may be deposited at a higher horizontal deposition rate than not only the intermediate layer EML but also the pixel electrode layer PXEL.

For example, a second substrate SUB2 may be placed on the common electrode CME, and the first substrate SUB1 and the second substrate SUB2 may be bonded to each other through a sealing member SEAL. As a result, a display device including a display panel PNL as illustrated in FIGS. 6 and 7 may be fabricated.

Figure 22:
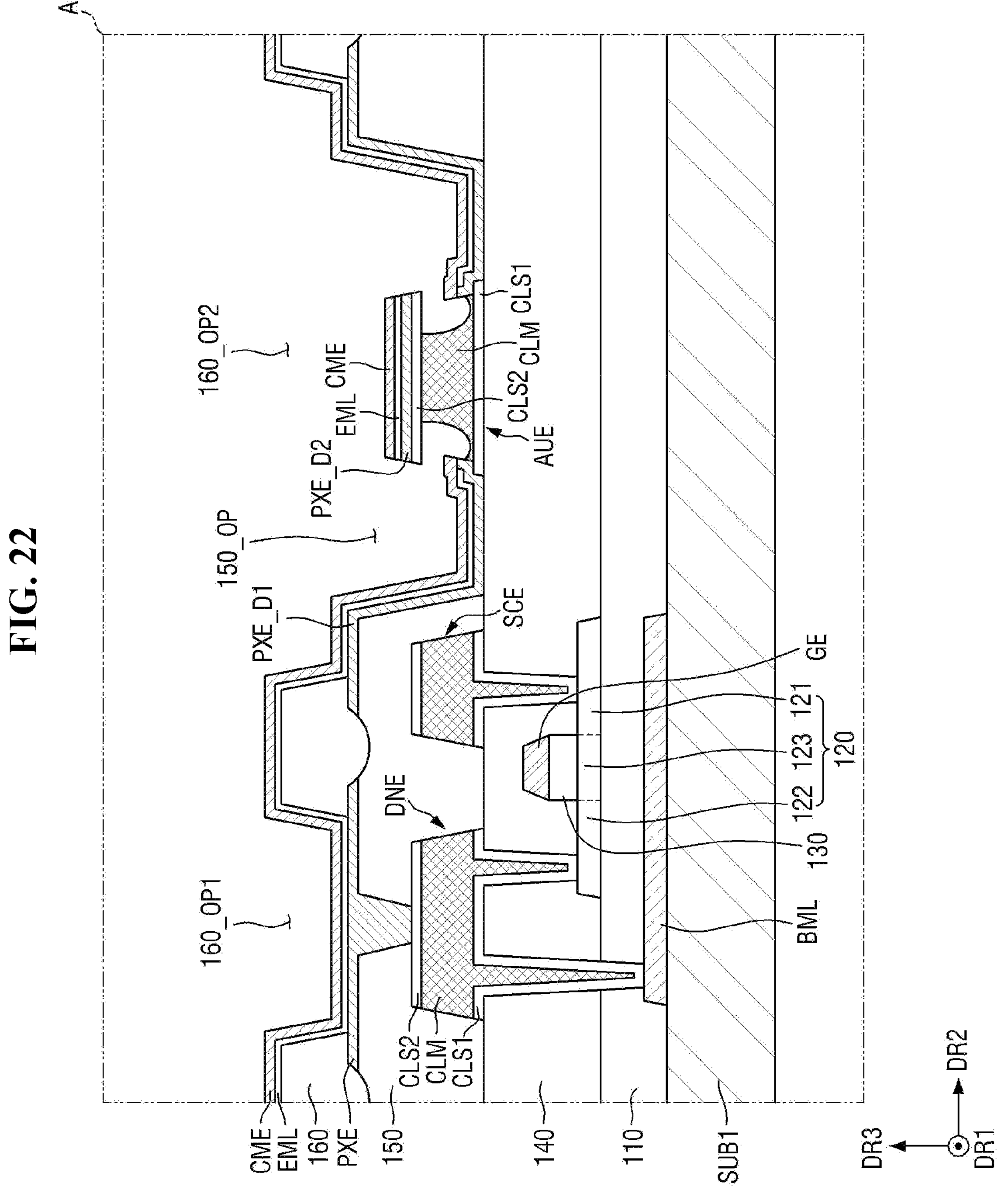
FIG. 22 is a schematic cross-sectional view of a display panel of a display device according to an embodiment.

FIG. 22 is a schematic cross-sectional view of a display panel of a display device according to an embodiment.

In the embodiment of FIG. 22, a common electrode CME may extend onto a portion of a side portion of a first dummy pixel electrode PXE_D1 which is exposed without being covered by an intermediate layer EML on the side of an auxiliary electrode AUE, but may not extend to a side surface of a main conductive layer CLM of the auxiliary electrode AUE and thus may not directly contact the main conductive layer CLM. For example, the common electrode CME may be connected (e.g., electrically connected) to the first dummy pixel electrode PXE_D1 through a portion in contact with the side portion of the first dummy pixel electrode PXE_D1 and may be connected (e.g., electrically connected) to the auxiliary electrode AUE through the first dummy pixel electrode PXE_D1 in contact with the auxiliary electrode AUE.

Figure 23:
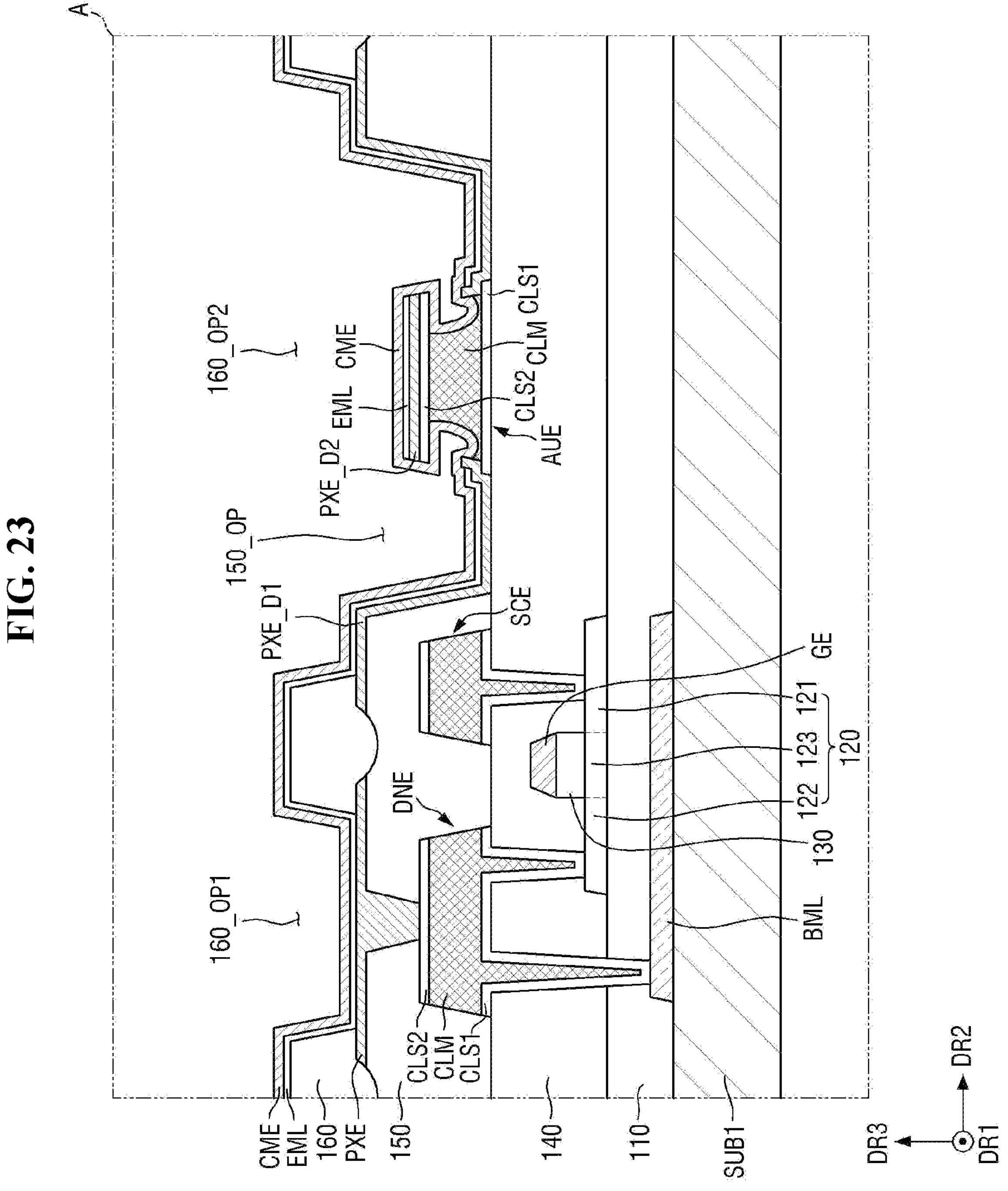
FIG. 23 is a schematic cross-sectional view of a display panel of a display device according to an embodiment.

FIG. 23 is a schematic cross-sectional view of a display panel of a display device according to an embodiment.

The embodiment of FIG. 23 shows that a common electrode CME may cover the whole of side surfaces of a main conductive layer CLM. Furthermore, the common electrode CME may be formed even on a lower surface of a second sub-conductive layer CLS2 exposed by an undercut structure. In some cases, the common electrode CME may be formed even on side surfaces of the second sub-conductive layer CLS2, side surfaces of a second dummy pixel electrode PXE_D2, and side surfaces of an intermediate layer EML. Therefore, the common electrode CME on an upper surface of an auxiliary electrode AUE may be physically connected to the common electrode CME around (or adjacent to) the auxiliary electrode AUE. In case that a deposition process is performed by suppressing the straightness of a deposition material of the common electrode CME and increasing a horizontal deposition rate, a structure in which all of the common electrodes CME are integrally connected (or integral with each other) as illustrated in FIG. 23 may be obtained.

Figure 24:
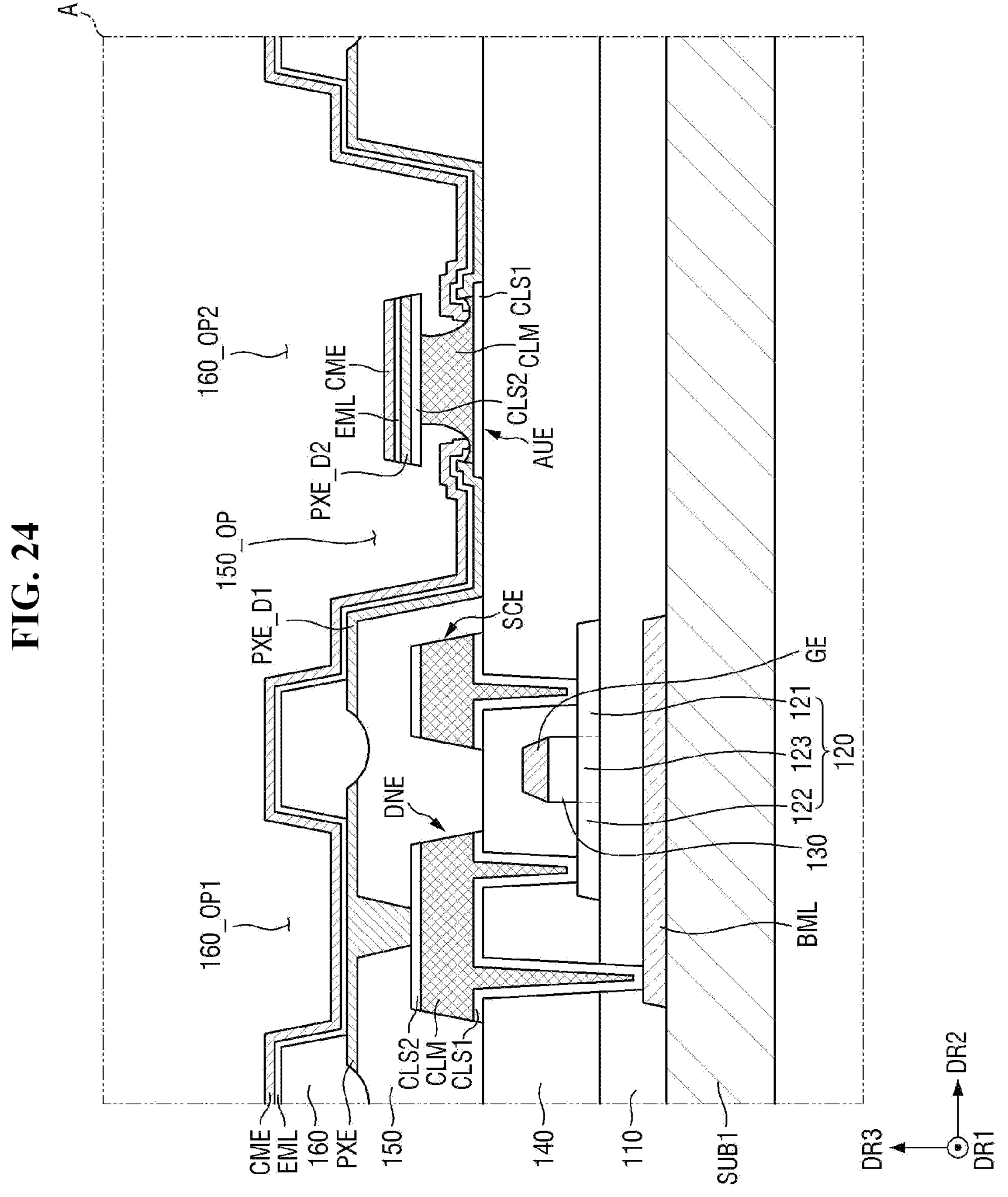
FIG. 24 is a schematic cross-sectional view of a display panel of a display device according to an embodiment.

FIG. 24 is a schematic cross-sectional view of a display panel of a display device according to an embodiment.

The embodiment of FIG. 24 shows that an intermediate layer EML may extend further toward an auxiliary electrode AUE to cover a side portion of a first dummy pixel electrode PXE_D1 adjacent to the auxiliary electrode AUE. For example, the intermediate layer EML may extend beyond a tip portion CLM_TP of a lower end portion CLM_B of a main conductive layer CLM to inside the tip portion CLM_TP, and the side portion of the first dummy pixel electrode PXE_D1 may be covered (e.g., completely covered) by the intermediate layer EML.

A common electrode CME may extend beyond the tip portion CLM_TP of the lower end portion CLM_B of the main conductive layer CLM to inside the tip portion CLM_TP. The common electrode CME may extend further toward the main conductive layer CLM than the intermediate layer EML and may directly contact the main conductive layer CLM in this extension portion.

In the current embodiment, since the first dummy pixel electrode PXE_D1 is covered by the intermediate layer EML, the first dummy pixel electrode PXE_D1 may not directly contact the common electrode CME. However, the first dummy pixel electrode PXE_D1 may be electrically connected to the common electrode CME through the main conductive layer CLM.

The current embodiment may be combined with the embodiment of FIG. 23. For example, the common electrode CME may have an integrally connected structure as in the embodiment of FIG. 23.

Figure 25:
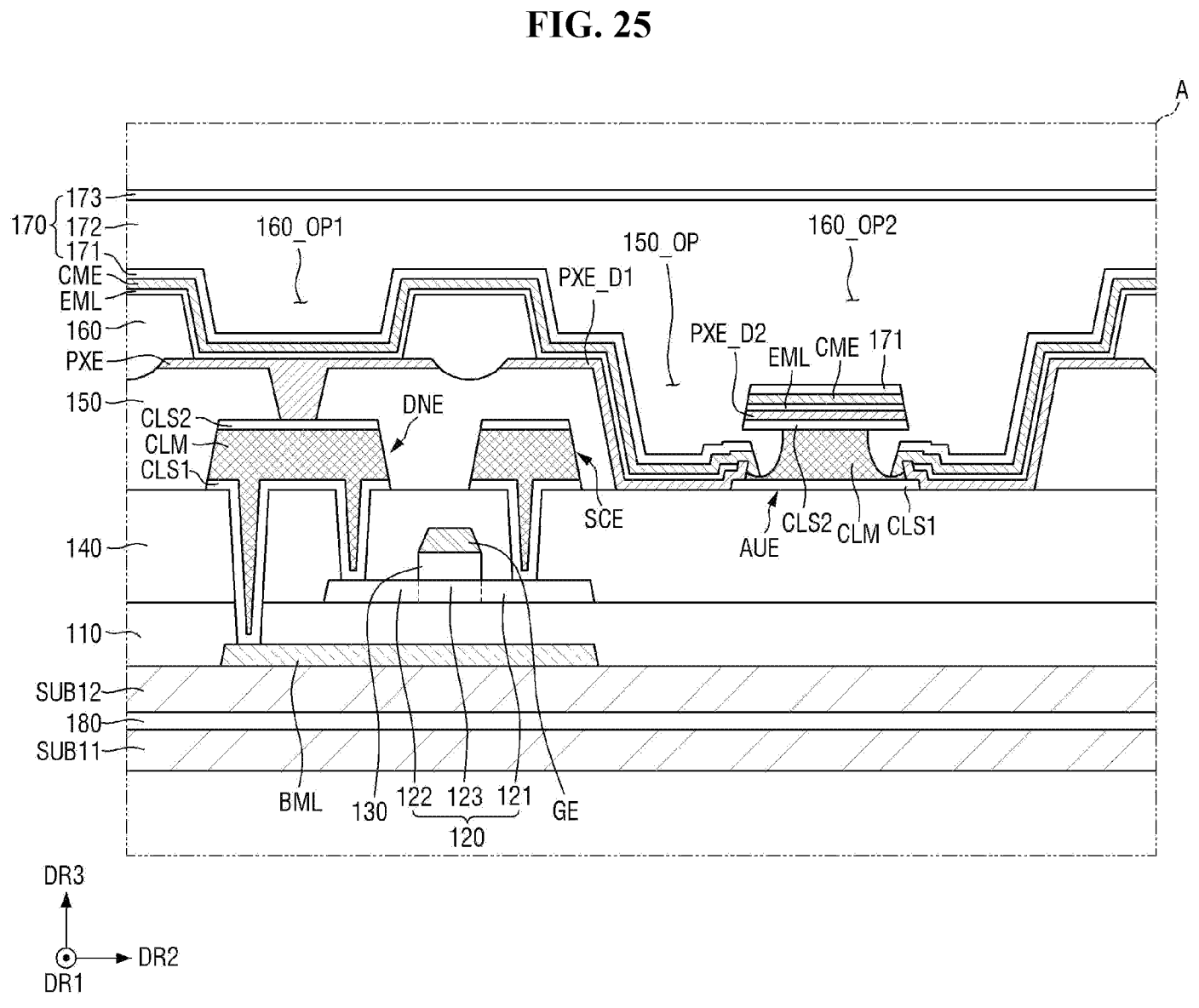

FIG. 25 is a schematic cross-sectional view of a display panel of a display device according to an embodiment.

The embodiment of FIG. 25 shows that the display panel of the display device may be a flexible display panel PNL.

Referring to FIG. 25, a substrate (e.g., SUB_11 and SUB_12) may have flexible characteristics. The substrate may be curved, bent, folded, rolled, or stretched. The substrate may be made of, for example, an insulating material such as polymer resin. The polymer material may be, for example, polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

In an embodiment, the substrate may include sub-substrates SUB_11 and SUB_12. For example, the substrate may include a first sub-substrate SUB_11 and a second sub-substrate SUB_12 stacked in the third direction DR3. Each of the first sub-substrate SUB_11 and the second sub-substrate SUB_12 may be a flexible substrate made of polyimide or the like. The substrate may further include a barrier layer 180 disposed between the first sub-substrate SUB_11 and the second sub-substrate SUB_12. The barrier layer 180 may include silicon nitride, silicon oxide, or silicon oxynitride. For example, a barrier layer may be disposed on the second sub-substrate SUB_12.

A circuit element layer and a light emitting element layer disposed on the substrate (e.g., SUB_11 and SUB_12) may be substantially the same as those in the embodiment of FIGS. 6 and 7, and thus a redundant description thereof will be omitted for descriptive convenience.

A thin-film encapsulation layer 170 may be disposed on the common electrode CME. The thin-film encapsulation layer 170 may include a first inorganic encapsulation layer 171, an organic encapsulation layer 172, and a second inorganic encapsulation layer 173 stacked sequentially. Each of the first inorganic encapsulation layer 171 and the second inorganic encapsulation layer 173 may include silicon nitride, silicon oxide, or silicon oxynitride. The organic encapsulation layer 172 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The first inorganic encapsulation layer 171 may be disposed on the common electrode CME. The first inorganic encapsulation layer 171 may be separated from an auxiliary electrode AUE by the undercut shape of the auxiliary electrode AUE.

The organic encapsulation layer 172 may be disposed on the first inorganic encapsulation layer 171. The organic encapsulation layer 172 may have a thick thickness to substantially remove a step difference between structures thereunder. An upper surface of the organic encapsulation layer 172 may be flat, but embodiments are not limited thereto. The organic encapsulation layer 172 may at least partially fill an empty space defined by the undercut shape of the auxiliary electrode AUE, and further, may fill (e.g., completely fill) the empty space as illustrated in the drawing.

The second inorganic encapsulation layer 173 may be disposed on the organic encapsulation layer 172. For example, the first inorganic encapsulation layer 171 and the second inorganic encapsulation layer 173 may contact each other in a part of a non-display area NDA or a display area DPA to encapsulate a space between the first inorganic encapsulation layer 171 and the second inorganic encapsulation layer 173.

In an embodiment, the thin-film encapsulation layer 170 may perform the encapsulation function of the second substrate SUB2 of FIGS. 6 and 7. Since the thin-film encapsulation layer 170 has flexible characteristics compared with a glass substrate, the display panel PNL employing the thin-film encapsulation layer 170 may have flexible characteristics.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a substrate;

a thin-film transistor disposed on the substrate, the thin-film transistor comprising a semiconductor layer;

an interlayer insulating layer disposed on the thin-film transistor;

a data conductive layer disposed on the interlayer insulating layer and comprising an auxiliary electrode and a transistor electrode connected to the semiconductor layer of the thin-film transistor, each of the auxiliary electrode and the transistor electrode comprising:

a main conductive layer, and an upper sub-conductive layer disposed on an upper surface of the main conductive layer;

a via layer disposed on the data conductive layer;

a pixel electrode layer disposed on the via layer, the pixel electrode layer comprising:

a pixel electrode connected to the transistor electrode through a contact hole penetrating the via layer, and a dummy pixel electrode separated from the pixel electrode, the dummy pixel electrode comprising:

a first dummy pixel electrode disposed adjacent to the auxiliary electrode, and a second dummy pixel electrode disposed on an upper surface of the auxiliary electrode and separated from the first dummy pixel electrode;

an intermediate layer disposed on the pixel electrode layer, the intermediate layer comprising:

a first portion disposed adjacent to the auxiliary electrode, and a second portion disposed on the upper surface of the auxiliary electrode and separated from the first portion of the intermediate layer; and a common electrode disposed on the intermediate layer, the common electrode comprising:

a first portion disposed adjacent to the auxiliary electrode, and a second portion disposed on the upper surface of the auxiliary electrode, wherein the auxiliary electrode has an undercut shape in which side surfaces of the main conductive layer are disposed inner than side surfaces of the upper sub-conductive layer of the auxiliary electrode, the first portion of the intermediate layer exposes an end portion of the first dummy pixel electrode disposed on a side of the auxiliary electrode, and the first portion of the common electrode contacts the first dummy pixel electrode exposed by the first portion of the intermediate layer.

2. The display device of claim 1, wherein the main conductive layer of the transistor electrode and the main conductive layer of the auxiliary electrode comprise aluminum, and the upper sub-conductive layer of the transistor electrode and the upper sub-conductive layer of the auxiliary electrode comprise titanium.

3. The display device of claim 2, wherein the auxiliary electrode has a width by which the side surfaces of the upper sub-conductive layer protrude from the side surfaces of the main conductive layer, and the width of the auxiliary electrode is in a range of about 0.3 μm or more.

4. The display device of claim 2, wherein a lower end portion of the main conductive layer of the auxiliary electrode comprises a tip portion.

5. The display device of claim 2, wherein each of the auxiliary electrode and the transistor electrode further comprises a lower sub-conductive layer disposed on a bottom surface of the main conductive layer and comprising titanium.

6. The display device of claim 5, wherein side surfaces of the lower sub-conductive layer of the auxiliary electrode protrude from the side surfaces of the main conductive layer.

7. The display device of claim 6, wherein the auxiliary electrode has a width, by which the side surfaces of the lower sub-conductive layer protrude from the side surfaces of the main conductive layer, is smaller than the width of the auxiliary electrode by which the side surfaces of the upper sub-conductive layer protrude from the side surfaces of the main conductive layer.

8. The display device of claim 5, wherein the first dummy pixel electrode contacts the lower sub-conductive layer.

9. The display device of claim 1, wherein the first portion of the common electrode contacts a side surface of the main conductive layer of the auxiliary electrode.

10. The display device of claim 9, wherein the common electrode further comprises a third portion disposed on a lower surface of the upper sub-conductive layer, and the first portion, the second portion and the third portion of the common electrode are integral with each other.

11. The display device of claim 1, wherein each of the auxiliary electrode and the transistor electrode further comprises a lower sub-conductive layer disposed on a bottom surface of the main conductive layer, side surfaces of the lower sub-conductive layer of the auxiliary electrode protrude from the side surfaces of the main conductive layer of the auxiliary electrode, and the lower sub-conductive layer of the auxiliary electrode contacts the first dummy pixel electrode.

12. The display device of claim 1, further comprising a scan wiring and a data wiring driving the thin-film transistor, wherein the data wiring and the auxiliary electrode extend in a first direction, and the scan wiring extends in a second direction intersecting the first direction.

13. The display device of claim 12, wherein the via layer comprises an opening exposing the auxiliary electrode.

14. The display device of claim 13, wherein the opening of the via layer extends in the first direction.

15. The display device of claim 1, wherein the pixel electrode and the first dummy pixel electrode are separated from each other on an upper surface of the via layer, and the upper surface of the via layer exposed between the pixel electrode and the first dummy pixel electrode is recessed.

16. A display device comprising:

a substrate;

a first electrode and a second electrode disposed on the substrate, each of the first and second electrodes comprising a first sub-conductive layer, a main conductive layer and a second sub-conductive layer that are stacked sequentially; and a via layer covering the first electrode and exposing the second electrode, wherein a side surface of the first sub-conductive layer of the first electrode facing a direction parallel to the substrate, a side surface of the main conductive layer of the first electrode facing the direction parallel to the substrate, and a side surface of the second sub-conductive layer of the first electrode facing the direction parallel to the substrate are aligned with each other along a same plane, and side surfaces of the main conductive layer of the second electrode are disposed inner than side surfaces of the first sub-conductive layer of the second electrode and side surfaces of the second sub-conductive layer of the second electrode.

17. The display device of claim 16, wherein the main conductive layer of the first electrode and the main conductive layer of the second electrode comprise aluminum, and the first and second sub-conductive layers of the first electrode and the first and second sub-conductive layers of the second electrode comprise titanium.

18. The display device of claim 17, wherein a lower end portion of the main conductive layer of the second electrode is recessed inward from imaginary side surfaces, which connect the side surfaces of the first sub-conductive layer of the second electrode and the side surfaces of the second sub-conductive layer of the second electrode, by a first width, and an upper end portion of the main conductive layer of the second electrode is recessed inward from the imaginary side surfaces by a second width greater than the first width.

19. The display device of claim 18, wherein the first width is in a range of about 0.05 μm to about 0.15 μm, and the second width is in a range of about 0.25 μm to about 0.35 μm.

20. The display device of claim 18, wherein the lower end portion of the main conductive layer of the second electrode comprises a tip portion.

21. The display device of claim 16, wherein the main conductive layer of the first electrode and the main conductive layer of the second electrode comprise aluminum, and the first and second sub-conductive layers of the first electrode and the first and second sub-conductive layers of the second electrode comprise titanium.

22. A display device comprising:

a substrate;

a thin-film transistor disposed on the substrate, the thin-film transistor comprising a semiconductor layer;

an interlayer insulating layer disposed on the thin-film transistor;

a data conductive layer disposed on the interlayer insulating layer and comprising an auxiliary electrode and a transistor electrode connected to the semiconductor layer of the thin-film transistor, each of the auxiliary electrode and the transistor electrode comprising:

a main conductive layer, and an upper sub-conductive layer disposed on an upper surface of the main conductive layer;

a via layer disposed on the data conductive layer;

a pixel electrode layer disposed on the via layer, the the pixel electrode layer comprising:

a pixel electrode connected to the transistor electrode through a contact hole penetrating the via layer, and a dummy pixel electrode separated from the pixel electrode, the dummy pixel electrode comprising:

a first dummy pixel electrode disposed adjacent to the auxiliary electrode, and a second dummy pixel electrode disposed on an upper surface of the auxiliary electrode and separated from the first dummy pixel electrode;

an intermediate layer disposed on the pixel electrode layer, the intermediate layer comprising:

a first portion disposed adjacent to the auxiliary electrode, and a second portion disposed on the upper surface of the auxiliary electrode and separated from the first portion of the intermediate layer; and a common electrode disposed on the intermediate layer, the common electrode comprising:

a first portion disposed adjacent to the auxiliary electrode, and a second portion disposed on the upper surface of the auxiliary electrode, wherein the auxiliary electrode has an undercut shape in which side surfaces of the main conductive layer are disposed inner than side surfaces of the upper sub-conductive layer of the auxiliary electrode, the first portion of the intermediate layer covers an end portion of the first dummy pixel electrode disposed on a side of the auxiliary electrode, and the first portion of the common electrode contacts a side surface of the main conductive layer of the auxiliary electrode.

23. The display device of claim 22, wherein the first dummy pixel electrode and the common electrode do not directly contact each other.

24. The display device of claim 23, wherein the first dummy pixel electrode and the common electrode are electrically connected through the main conductive layer of the auxiliary electrode.

* * * * *